(12) United States Patent
Watanabe et al.

(10) Patent No.: US 10,366,755 B2
(45) Date of Patent: *Jul. 30, 2019

(54) SEMICONDUCTOR DEVICE INCLUDING TCAM CELL ARRAYS CAPABLE OF SKIPPING TCAM-CELL SEARCH IN RESPONSE TO CONTROL SIGNAL

(71) Applicant: RENESAS ELECTRONICS CORPORATION, Tokyo (JP)

(72) Inventors: Naoya Watanabe, Tokyo (JP); Futoshi Igaue, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/056,321

(22) Filed: Aug. 6, 2018

(65) Prior Publication Data

US 2018/0350439 A1 Dec. 6, 2018

Related U.S. Application Data

(63) Continuation of application No. 15/787,406, filed on Oct. 18, 2017, now Pat. No. 10,068,646, which is a (Continued)

(30) Foreign Application Priority Data

Aug. 28, 2015 (JP) .................................. 2015-168522

(51) Int. Cl.
*G11C 15/00* (2006.01)
*G11C 15/04* (2006.01)

(52) U.S. Cl.
CPC .............. *G11C 15/04* (2013.01); *G11C 15/00* (2013.01); *G11C 15/046* (2013.01)

(58) Field of Classification Search
CPC ........ G11C 15/04; G11C 15/00; G11C 15/046
(Continued)

(56) References Cited

U.S. PATENT DOCUMENTS 4,942,556 A 7/1990 Sasaki et al.
6,731,526 B2 5/2004 Inoue
(Continued)

FOREIGN PATENT DOCUMENTS

JP 63-31091 A 2/1988
JP 10-275479 A 10/1998
(Continued)

OTHER PUBLICATIONS

Hisatada Miyatake et al., "A Design for High-Speed Low-Power CMOS Fully Parallel Content-Addressable Memory Macros", IEEE Journal of Solid-State Circuits, vol. 36, No. 6, Jun. 2001, pp. 956-968.
(Continued)

*Primary Examiner* — Connie C Yoha
(74) *Attorney, Agent, or Firm* — McDermott Will & Emery LLP

(57) ABSTRACT

The consumption current of a TCAM device is reduced. A semiconductor device includes multiple sub-arrays each including a TCAM cell array. Each sub-array searches the corresponding part of the input search data. Each sub-array outputs the search result indicative of a match for every entry without searching, when the corresponding first control signal is activated.

6 Claims, 31 Drawing Sheets

Related U.S. Application Data continuation of application No. 15/227,161, filed on Aug. 3, 2016, now Pat. No. 9,824,757.

(58) Field of Classification Search
USPC .................. 365/49.11, 49.17, 49.18, 203
See application file for complete search history.

(56) References Cited

U.S. PATENT DOCUMENTS

| | | | |
|---|---|---|---|
| 7,203,081 B2 | 4/2007 | Nishiyama et al. | |
| 7,274,581 B1* | 9/2007 | Powell ................. | G11C 15/00 365/200 |
| 8,320,148 B1* | 11/2012 | Derhacobian ........ | G11C 15/046 365/49.1 |
| 8,441,828 B2 | 5/2013 | Watanabe | |
| 10,068,646 B2* | 9/2018 | Watanabe ............. | G11C 15/04 |
| 2006/0193160 A1 | 8/2006 | Hanzawa et al. | |
| 2008/0062804 A1* | 3/2008 | Wang .................... | G11C 15/00 365/230.03 |
| 2009/0135052 A1* | 5/2009 | Driggs .................. | G01S 7/021 342/195 |
| 2010/0232195 A1 | 9/2010 | Park | |
| 2011/0216569 A1 | 9/2011 | Akiyama | |
| 2013/0258739 A1 | 10/2013 | Kishida | |
| 2017/0060438 A1 | 3/2017 | Igaue et al. | |
| 2017/0062051 A1 | 3/2017 | Watanabe et al. | |

FOREIGN PATENT DOCUMENTS

| | | |
|---|---|---|
| JP | 2003-272386 A | 9/2003 |
| JP | 2005-228461 A | 8/2005 |

OTHER PUBLICATIONS

Non-Final Office Action issued in related parent U.S. Appl. No. 15/787,406, dated Nov. 16, 2017.

Notice of Allowance issued in related parent U.S. Appl. No. 15/787,406, dated May 10, 2018.

Japanese Office Action issued in corresponding Japanese Patent Application No. 2015-168522, dated Sep. 18, 2018, with English Translation.

* cited by examiner

| SRAM CELL (X CELL) | SRAM CELL (Y CELL) | TCAM CELL DATA |
|---|---|---|
| "1" | "0" | "0" |
| "0" | "1" | "1" |
| "0" | "0" | "x" (don't care) |
| "1" | "1" | NOT USED |

FIG. 7

| PROTOCOL NUMBER | DESTINATION PORT NUMBER | SOURCE PORT NUMBER | DESTINATION IP ADDRESS | SOURCE IP ADDRESS |
|---|---|---|---|---|
| 17 | 750:750 | 53:53 | 189.167.79.44/32 | 147.121.56.152/29 |
| 6 | 123:123 | 0:65535 | 224.180.117.99/32 | 147.121.56.146/32 |
| 17 | 1024:65535 | 69:69 | 189.167.79.44/32 | 147.121.56.146/32 |
| ... | ... | ... | ... | ... |

| PROTOCOL NUMBER | DESTINATION PORT NUMBER | SOURCE PORT NUMBER | DESTINATION IP ADDRESS | SOURCE IP ADDRESS |
|---|---|---|---|---|
| 0001_0001 | 0000_0010_1110_1110 | 0000_0000_0011_0101 | 1011_1101_1010_0111_0100_1111_0010_0011 | 1001_0011_0111_1001_0011_1000_1001_1xxx |
| 0000_0110 | 0000_0000_0111_1011 | xxxx_xxxx_xxxx_xxxx | 1110_0000_1011_0100_0111_0101_0110_0011 | 1001_0011_0111_1001_0011_1000_1001_0010 |
| 0001_0001 | 0000_01xx_xxxx_xxxx | 0000_0000_0100_0101 | 1011_1101_1010_0111_0100_1111_0010_1100 | 1001_0011_0111_1001_0011_1000_1001_0010 |
| 0001_0001 | 0000_1xxx_xxxx_xxxx | 0000_0000_0100_0101 | 1011_1101_1010_0111_0100_1111_0010_1100 | 1001_0011_0111_1001_0011_1000_1001_0010 |
| 0001_0001 | 0001_xxxx_xxxx_xxxx | 0000_0000_0100_0101 | 1011_1101_1010_0111_0100_1111_0010_1100 | 1001_0011_0111_1001_0011_1000_1001_0010 |
| 0001_0001 | 001x_xxxx_xxxx_xxxx | 0000_0000_0100_0101 | 1011_1101_1010_0111_0100_1111_0010_1100 | 1001_0011_0111_1001_0011_1000_1001_0010 |
| 0001_0001 | 01xx_xxxx_xxxx_xxxx | 0000_0000_0100_0101 | 1011_1101_1010_0111_0100_1111_0010_1100 | 1001_0011_0111_1001_0011_1000_1001_0010 |
| 0001_0001 | 1xxx_xxxx_xxxx_xxxx | 0000_0000_0100_0101 | 1011_1101_1010_0111_0100_1111_0010_1100 | 1001_0011_0111_1001_0011_1000_1001_0010 |
| ... | ... | ... | ... | ... |

201, 202, 203

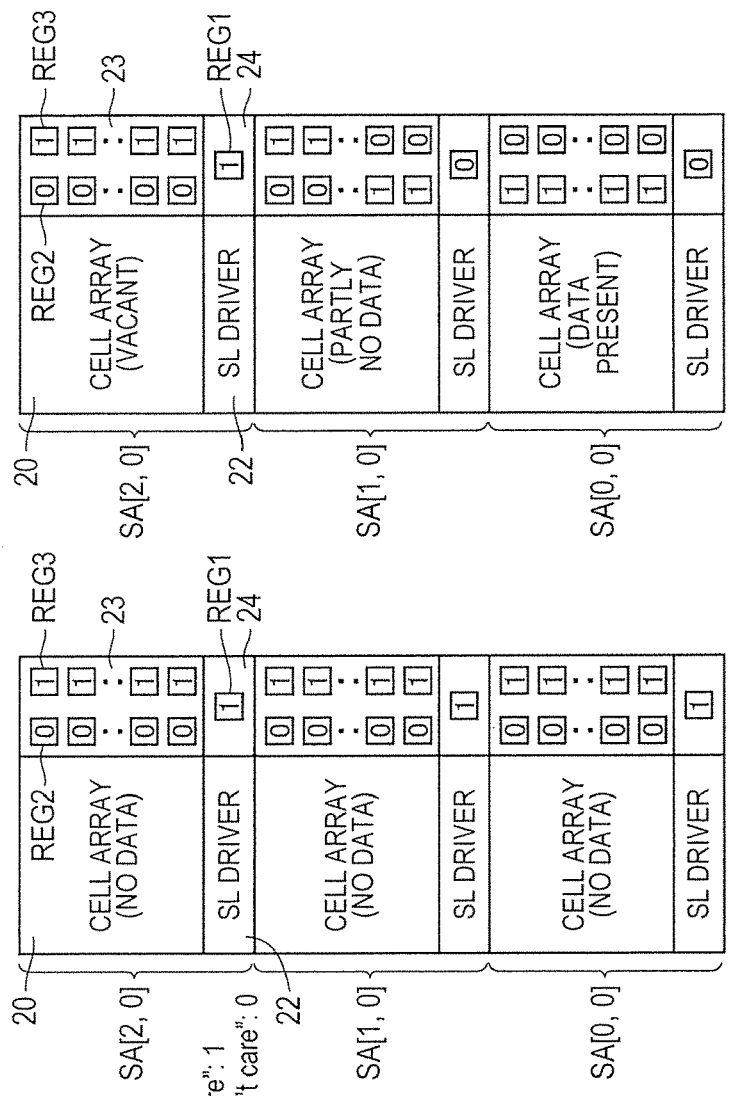

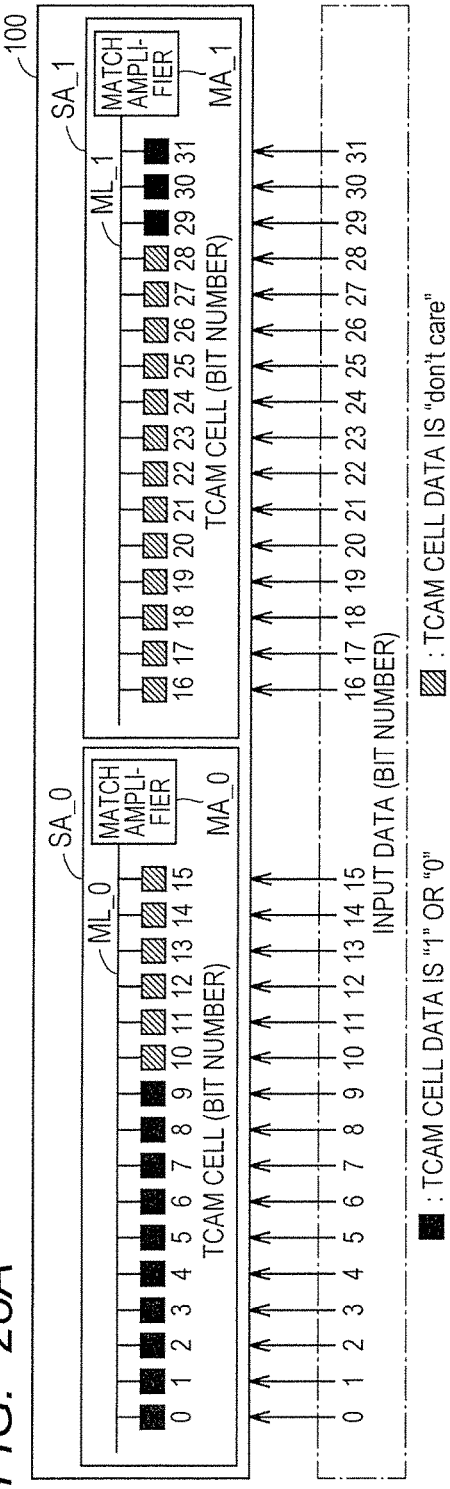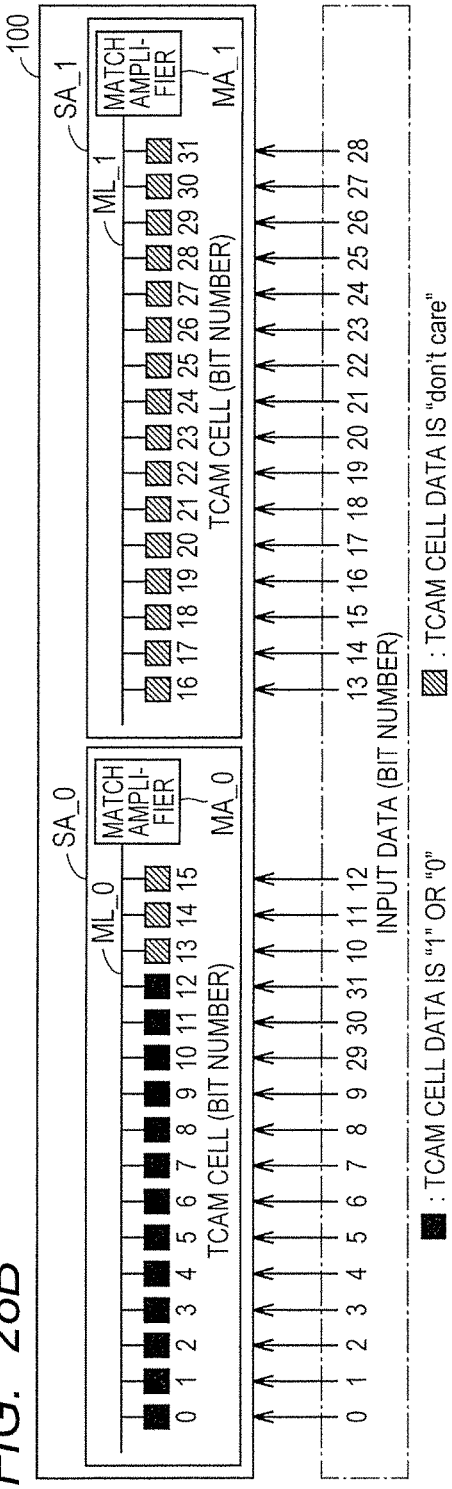

SEMICONDUCTOR DEVICE INCLUDING TCAM CELL ARRAYS CAPABLE OF SKIPPING TCAM-CELL SEARCH IN RESPONSE TO CONTROL SIGNAL

CROSS-REFERENCE TO RELATED APPLICATIONS

This application is a Continuation of U.S. patent application Ser. No. 15/787,406, filed on Oct. 18, 2017, which is a Continuation of U.S. patent application Ser. No. 15/227,161, filed on Aug. 3, 2016, now U.S. Pat. No. 9,824,757, which claims the benefit of Japanese Patent Application No. 2015-168522 filed on Aug. 28, 2015 including the specification, drawings and abstract is incorporated herein by reference in its entirety.

BACKGROUND

The present invention relates to a semiconductor device and is employed suitably for a semiconductor device provided with a TCAM (Ternary Content Addressable Memory) device for example.

A memory device called an associative memory or a CAM (Content Addressable Memory) searches a data word matching a search word out of stored data words and when a matching data word is found, the memory device outputs the address of the matched data word.

There are a BCAM (Binary CAM) and a TCAM (Ternary CAM) in the CAM. Each memory cell of the BCAM stores information of either "0" or "1." On the other hand, each memory cell of the TCAM can store information of a "don't care" in addition to "0" and "1." A "don't care" can take any value of "0" and "1."

The TCAM device is broadly used in a router for networks, such as the Internet, for the purpose of the address search and the access control. In order to respond to the increase in capacity, the TCAM device usually has a configuration in which multiple sub-arrays are provided and search operations for each of the sub-arrays are performed concurrently. For example, according to Non-patent Document 1, sub-arrays called building blocks are arranged with eight pieces in the word-line direction and four pieces in the bit-line direction.

The TCAM device can compare input search data (input packet) with TCAM cell data all at once; accordingly, it operates at higher speed than an RAM (Random Access Memory) in all the search applications. However, a search current is generated at the time of search, bringing up an issue of increase in the electric power consumption.

Japanese Unexamined Patent Application Publication No. 2003-272386 (Patent Literature 1) discloses a TCAM device of a configuration in which multiple sub-arrays arranged in the match-line direction are linked under a pipeline system, for the purpose of the low power consumption. In the TCAM device disclosed by the present literature, a search in the following stage is performed only for the entries matched in the previous stage.

Patent Literature (Patent Literature 1) Japanese Unexamined Patent Application Publication No. 2003-272386

Non-Patent Document (Non-patent Document 1) H. Miyatake et. al., "A design for high-speed low-power CMOS fully parallel content-addressable memory macros", IEEE J. Solid-State Circuits, Vol. 36, pp. 956-968, June 2001

SUMMARY

In the TCAM device, TCAM cells set as a don't care may exist collectively in some range. For example, it often occurs that all the TCAM cells coupled to a part of match lines of a sub-array are set as a don't care. As a more remarkable example, all the TCAM cells configuring a sub-array may be set as a don't care. In such a case, the search result is obvious (the search result is certainly a hit (match) irrespective of the search data); therefore, the electric current will be consumed in vain for the search operation.

The other issues and new features of the present invention will become clear from the description of the present specification and the accompanying drawings.

A semiconductor device according to one embodiment includes multiple sub-arrays each including a TCAM cell array. Each sub-array searches the corresponding part of the input search data. Each sub-array outputs the search result indicative of a match for every entry without searching, when the corresponding first control signal is activated.

According to the embodiment described above, it is possible to reduce the consumption current of the TCAM device.

BRIEF DESCRIPTION OF THE DRAWINGS

FIG. 7 is a table illustrating an example of an ACL rule file;

FIG. 8 is a drawing illustrating an example of the TCAM data obtained by converting the ACL illustrated in FIG. 7;

FIGS. 27A, 27B, and 27C are explanatory drawings illustrating the procedure of the data write to each of registers REG1, REG2, and REG3 after the power supply starting;

FIGS. 28A and 28B are explanatory drawings illustrating the array conversion of input data;

DETAILED DESCRIPTION

Hereinafter, each embodiment is described in detail with reference to accompanying drawings. In the following, the same reference symbol is attached to the same or corresponding element and the repeated explanation thereof is omitted.

<The Configuration Common to Each Embodiment>
[The Configuration of a TCAM Cell]

Figures 1, 2:
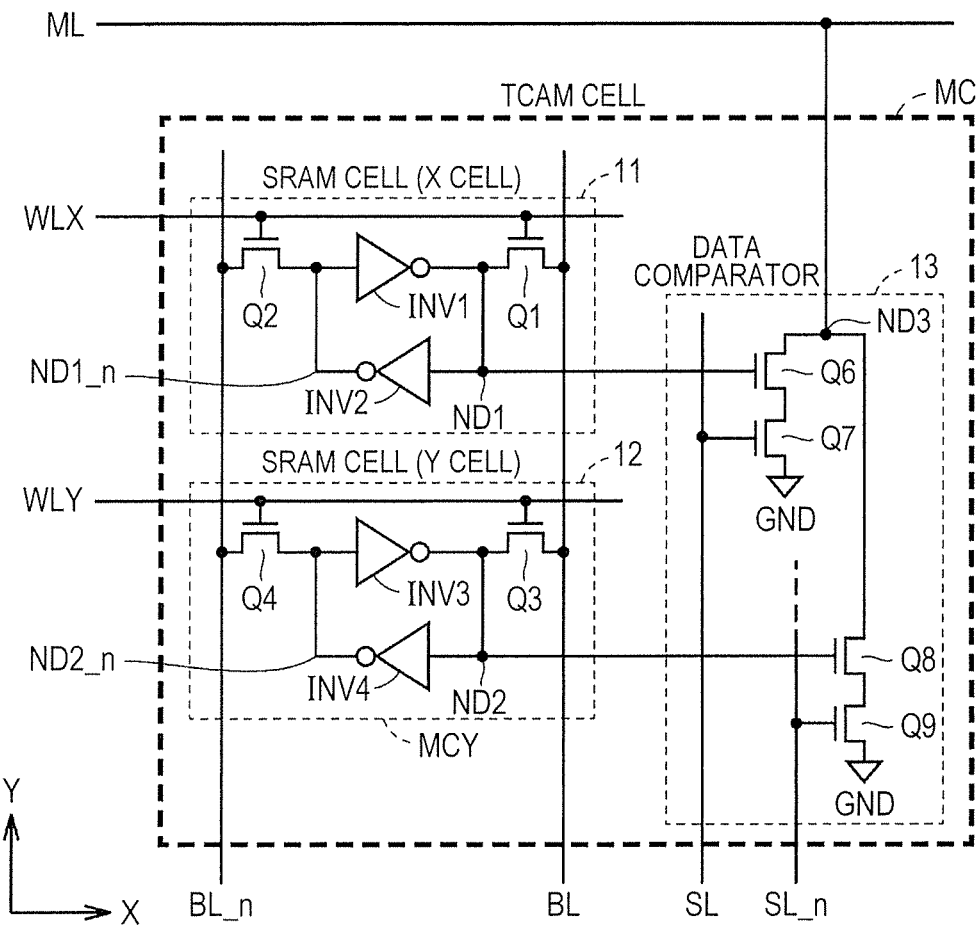
FIG. 1 is a circuit diagram illustrating an example of the configuration of a TCAM cell.
FIG. 2 is a table illustrating the correspondence relation of the memory contents of an X cell and a Y cell illustrated in FIG. 1 and the TCAM cell data.

FIG. 1 is a circuit diagram illustrating an example of the configuration of a TCAM cell. With reference to FIG. 1, a TCAM cell (also called a memory cell MC) includes two SRAM cells (Static Random Access Memory Cells) 11 and 12 and a data comparator 13. The SRAM cell 11 is also called an X cell and the SRAM cell 12 is also called a Y cell. The X cell 11 stores mutually complementary 1-bit data (when one side is "1", the other side is "0") at internal memory-node pairs ND1 and ND1_$n$. The Y cell stores mutually complementary 1-bit data at internal memory-node pairs ND2 and ND2_$n$.

The TCAM cell is coupled to bit-line pairs BL and BL_n, search-line pairs SL and SL_n, a match line ML, and word lines WLX and WLY. The bit-line pairs BL and BL_n are extended in the column direction (Y direction) of the TCAM cell array 20 illustrated in FIG. 3, and are shared by multiple TCAM cells arranged in the column direction. The search-line pairs SL and SL_n are extended in the column direction (Y direction) of the TCAM cell array 20, and are shared by multiple TCAM cells arranged in the column direction. The match line ML is extended in the row direction (X direction) of the TCAM cell array 20, and is shared by multiple TCAM cells arranged in the row direction. The word lines WLX and WLY are extended in the row direction (X direction) of the TCAM cell array 20, and are shared by multiple TCAM cells arranged in the row direction.

The X cell 11 includes inverters INV1 and INV2, and N channel MOS (Metal Oxide Semiconductor) transistors Q1 and Q2. The inverter INV1 is coupled between the memory node ND1 and the memory node ND1_$n$ so that the direction going from the memory node ND1_$n$ toward the memory node ND1 becomes a forward direction. The inverter INV2 is coupled to the inverter INV1 in parallel and in an opposite direction. The MOS transistor Q1 is coupled between the memory node ND1 and the bit line BL. The MOS transistor Q2 is coupled between the memory node ND1_$n$ and the bit line BL_n. The gates of the MOS transistors Q1 and Q2 are coupled to the word line WLX.

The Y cell 12 includes inverters INV3 and INV4, and MOS (Metal Oxide Semiconductor) transistors Q3 and Q4. The inverter INV3 is coupled between the memory node ND2 and the memory node ND2_$n$ so that the direction going from the memory node ND2_$n$ toward the memory node ND2 becomes a forward direction. The inverter INV4 is coupled to the inverter INV3 in parallel and in an opposite direction. The MOS transistor Q3 is coupled between the memory node ND2 and the bit line BL. The MOS transistor Q4 is coupled between the memory node ND2_$n$ and the bit line BL_n. The gates of the MOS transistors Q3 and Q4 are coupled to the word line WLY.

The data comparator 13 includes N-channel MOS transistors Q6-Q9. The MOS transistors Q6 and Q7 are coupled in series between a node ND3 as a connection point with the match line ML and a ground node GND. The MOS transistors Q8 and Q9 are coupled between the node ND3 and the ground node GND in series and in parallel with the whole of the series-coupled MOS transistors Q6 and Q7. The gates of the MOS transistors Q6 and Q8 are coupled to the memory nodes ND1 and ND2, respectively. The gates of the MOS transistors Q7 and Q9 are coupled to the search lines SL and SL_n, respectively.

FIG. 2 is a table illustrating the correspondence relation of the memory contents of the X cell and the Y cell illustrated in FIG. 1 and the TCAM cell data.

With reference to FIG. 1 and FIG. 2, the TCAM cell can store three values of "0", "1", and "x" (don't care) using a 2-bit SRAM cell. Specifically, when "1" is stored in the memory node ND1 of the X cell 11 and "0" is stored in the memory node ND2 of the Y cell 12, it is assumed that "0" is stored in the TCAM cell. When "0" is stored in the memory node ND1 of the X cell 11 and "1" is stored in the memory node ND2 of the Y cell 12, it is assumed that "1" is stored in the TCAM cell. When "0" is stored in the memory node ND1 of the X cell 11 and "0" is stored in the memory node ND2 of the Y cell 12, it is assumed that "x"

(don't care) is stored in the TCAM cell. The case where "1" is stored in the memory node ND1 of the X cell 11 and "1" is stored in the memory node ND2 of the Y cell 12 is not used.

According to the above-described configuration of the TCAM cell, when the search data is "1" (that is, the search line SL is "1" and the search line SL_n is "0") and the TCAM data is "0" (the memory node ND1 is "1" and the memory node ND2 is "0"), the MOS transistors Q6 and Q7 become an ON state. Therefore, the potential of the match line ML which has been precharged is drawn out to the ground potential. When the search data is "0" (that is, the search line SL is "0" and the search line SL_n is "1") and the TCAM data is "1" (the memory node ND1 is "0" and the memory node ND2 is "1"), the MOS transistors Q8 and Q9 become an ON state. Therefore, the potential of the match line ML which has been precharged is drawn out to the ground potential. That is, when the search data and the TCAM data are in a mismatch, the potential of the match line ML is drawn out to the ground potential.

On the contrary, when the inputted search data is "1" and the TCAM data is "1" or "x", or when the search data is "0" and the TCAM data is "0" or "X" (that is, when both match), the potential of the precharged match line ML (the level of the power supply potential VDD) is maintained.

As described above, in the TCAM, as far as the data of all the TCAM cells coupled to the match line ML corresponding to one entry (row) do not match with the input search data, the charge stored in the match line ML is drawn out. Therefore, although the search by the TCAM is performed at a high speed, the issue is that the consumption current is great.

[The Configuration of a Sub-Array]

Figure 3:
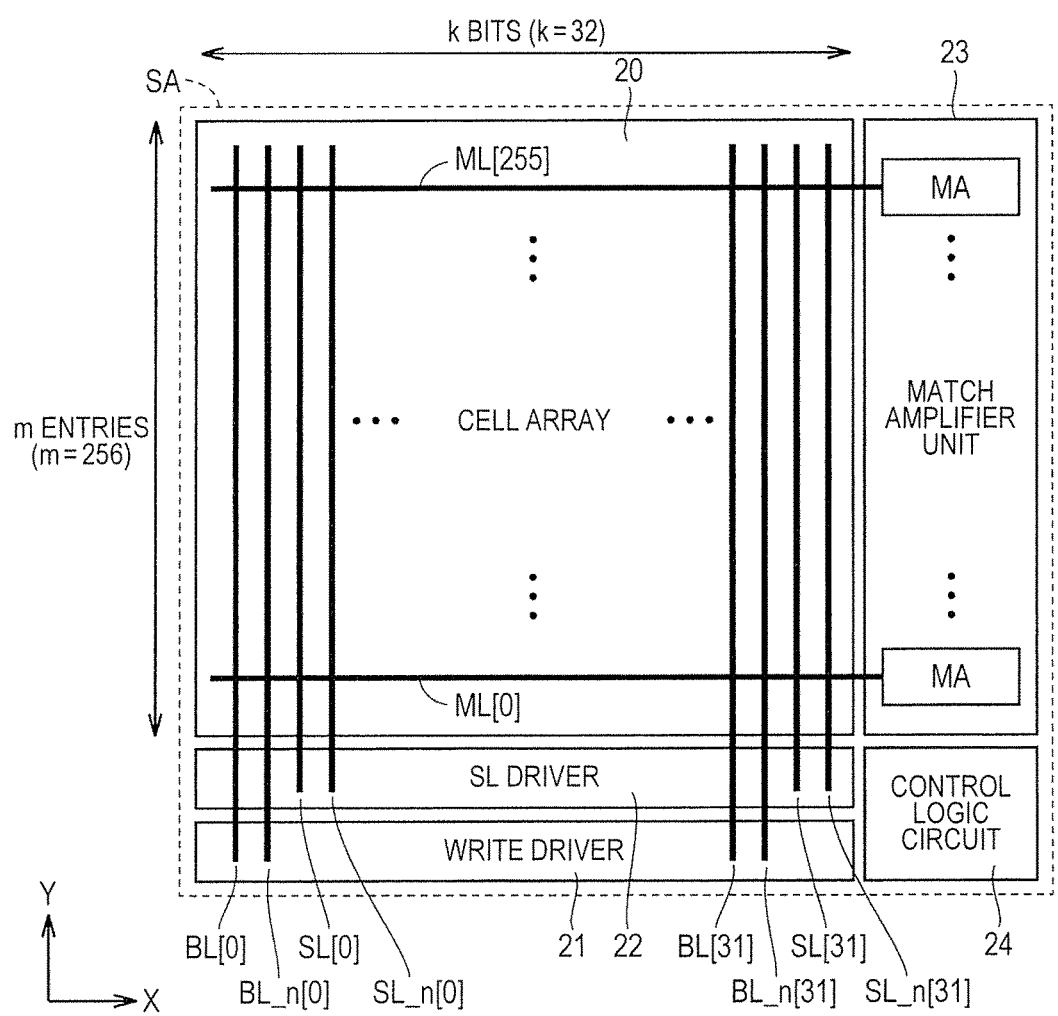
FIG. 3 is a block diagram illustrating the configuration of a sub-array which configures a TCAM device.

FIG. 3 is a block diagram illustrating the configuration of a sub-array which configures a TCAM device. With reference to FIG. 3, a sub-array SA includes a TCAM cell array 20 (simply called a cell array), a write driver 21, a search line (SL) driver 22, a match amplifier unit 23, and a control logic circuit 24. The sub-array SA further includes a word line driver (not shown) for driving the word lines WLX and WLY illustrated in FIG. 1.

The cell array 20 includes the TCAM cells arranged in a matrix (m rows by k columns). The cell array 20 illustrated in FIG. 3 has the number of rows (number of entry) m of 256 and the number of columns (number of bits) k of 32.

Corresponding to each column of the cell array 20, k bit-line pairs (k=32) (from BL[0] and BL_n[0] to BL[k−1] and BL_n[k−1]) and k search-line pairs (k=32) (from SL[0] and SL_n[0] to SL[k−1] and SL_n[k−1]) are provided. Corresponding to each row of the cell array 20, m match lines (m=256) (from ML[0] to ML[m−1]) and m word lines for the X cells (from WLX[0] to WLX[m−1]) (not shown) and m word lines for the Y cells (from WLY[0] to WLY[m−1]) (not shown) are provided.

The write driver 21 supplies write data to each TCAM cell via the bit-line pairs BL and BL_n at the time of write. The search line driver 22 supplies search data to each TCAM cell via the search-line pairs SL and SL_n at the time of search. The control logic circuit 24 controls the operation of the whole sub-array SA. For example, at the time of search, the control logic circuit 24 receives a search command and controls the operation of the search line driver 22, the match amplifier unit 23, and the precharge circuit, by outputting control signals to the search line driver 22 and the match amplifier unit 23.

The match amplifier unit 23 includes multiple match amplifiers MA corresponding to the rows of the cell array, respectively. At the time of search, the match amplifier MA detects whether the corresponding TCAM cell data matches the corresponding part of the input search data, based on the potential of the corresponding match line ML. In the present embodiment, the match amplifier MA includes a precharge circuit for precharging the corresponding match line ML at the time of search.

[The Configuration of the TCAM]

Figure 4:
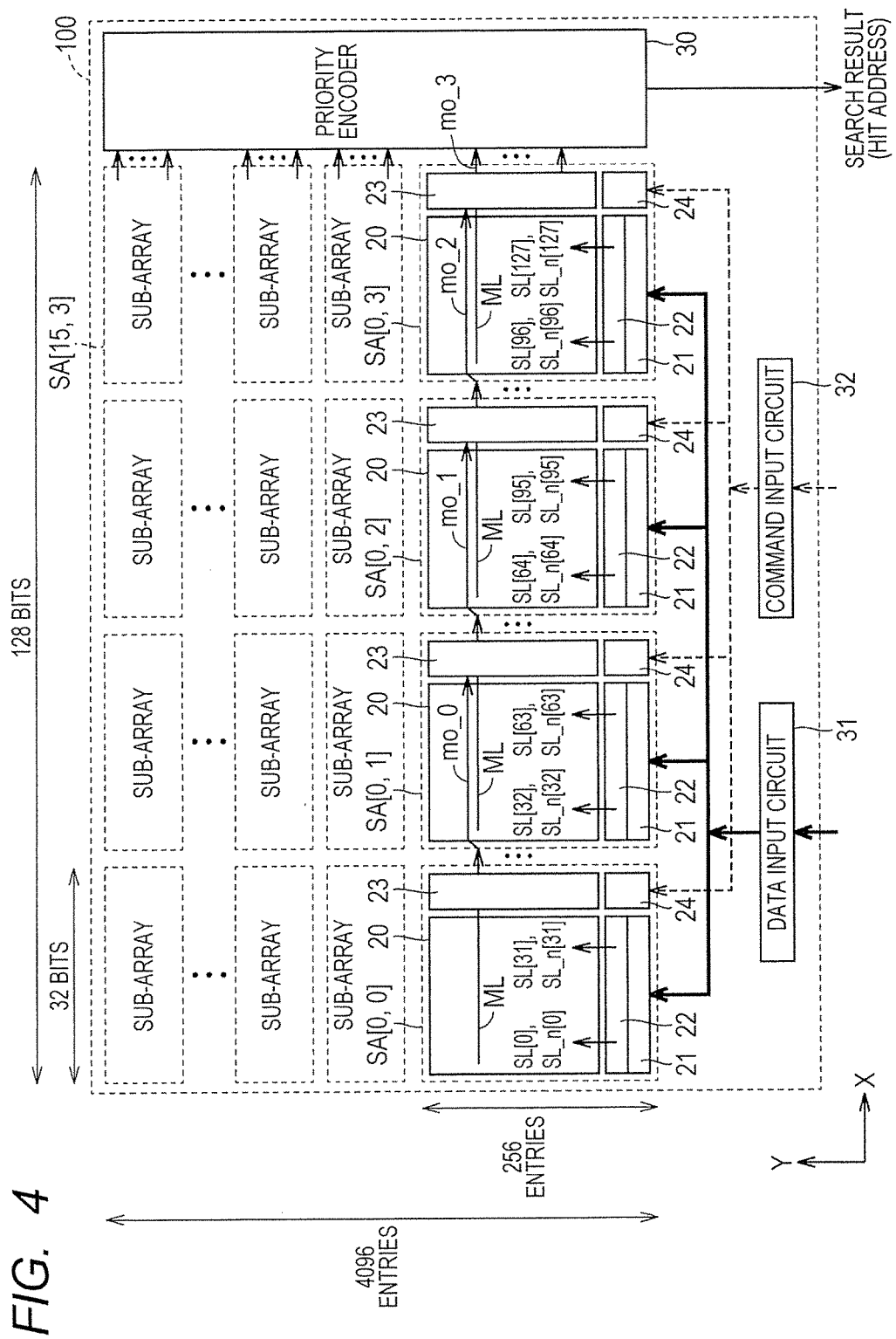
FIG. 4 is a block diagram illustrating the configuration of the TCAM device.

FIG. 4 is a block diagram illustrating the configuration of the TCAM device. With reference to FIG. 4, the TCAM device 100 includes multiple sub-arrays SA arranged in a matrix, a priority encoder 30, a data input circuit 31, and a command input circuit 32.

The search table size supported by the TCAM device illustrated in FIG. 4 is 128 bits as the bit length of one entry (1 row) and 4096 entries as the total number of entry. The TCAM device 100 is divided into sub-arrays SA[0, 0]-SA[15, 3] arranged in 16 rows by 4 columns. The size of each sub-array SA amounts to 256 entries as the total number of entry by 32 bits as the bit length of one entry. These numbers are only an example and the configuration of the TCAM device is not restricted to the present case.

The search-line pairs SL and SL_n, the bit-line pairs BL and BL_n, the match line ML, and the word line which are already explained are disposed for every sub-array. For example, the sub-array SA[0, 0] is provided with from the search-line pairs SL[0] and SL_n[0] to the search-line pairs SL[31] and SL_n[31]. The sub-array SA[0, 1] is provided with from the search-line pairs SL[32] and SL_n[32] to the search-line pairs SL[63] and SL_n[63]. The sub-array SA[0, 2] is provided with from the search-line pairs SL[64] and SL_n[64] to the search-line pairs SL[95] and SL_n[95]. The sub-array SA[0, 3] is provided with from the search-line pairs SL[96] and SL_n[96] to the search-line pairs SL[127] and SL_n[127].

As illustrated in FIG. 4, the match line ML is divided into four parts in unit of 32 bits with respect to the whole search data of one entry and the whole TCAM cell data (write data) of one entry. Therefore, as will be explained in FIG. 5, an AND gate (the reference symbol 26 in FIG. 5) for calculating the logical product of the detection result of each match amplifier MA is provided in the match amplifier unit 23 for every row.

At the time of data write, the data input circuit 31 receives the write data from the exterior (for example, a network processor unit illustrated in FIG. 6), and outputs the received write data to the corresponding write driver 21 of the sub-array SA. At the time of data search, the data input circuit 31 receives the search data from the exterior and outputs the received search data to the search line driver 22 of the corresponding sub-array SA.

The command input circuit 32 receives various kinds of commands, such as a write command and a search command, from the exterior, and outputs the received command to the control logic circuit 24 of the corresponding sub-array SA.

The priority encoder 30 receives the search result (whether the input search data and the TCAM data have matched or not) for every entry, from the adjacent sub-arrays SA[0, 3], SA[1, 3], . . . , SA[15, 3]. The priority encoder 30 outputs a hit address (the entry address storing the TCAM data which has matched with the search data). When multiple entries hit (match), the priority encoder 30 outputs the address of the hit entry with a higher priority.

[On the AND Operation of the Detection Results of Multiple Match Amplifiers for the Same Entry]

Figure 5:
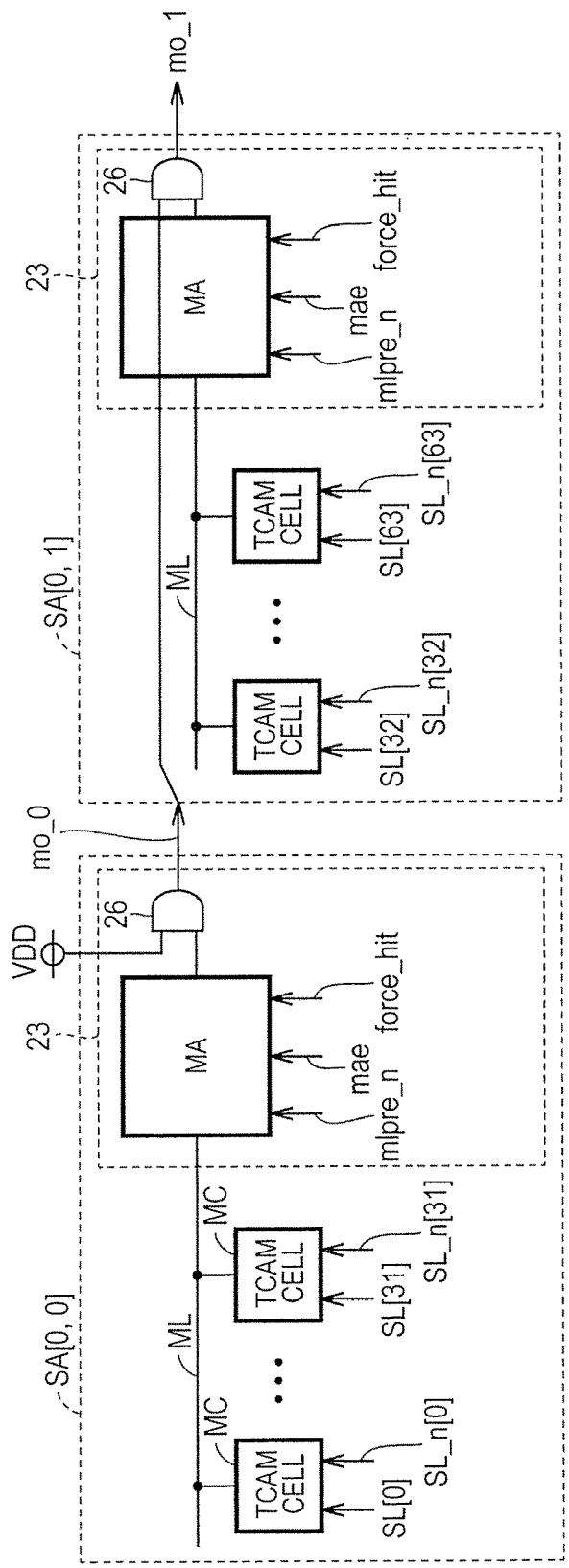
FIG. 5 is an explanatory drawing illustrating an AND operation of the detection result of each match amplifier.

FIG. 5 is an explanatory drawing illustrating an AND operation of the detection result of each match amplifier. FIG. 5 illustrates only one entry of the sub-arrays SA[0, 0] and SA[0, 1] representatively. However, same applies to other entries and other sub-arrays.

As illustrated in FIG. 5, the match amplifier unit 23 of each sub-array SA includes an AND gate 26 provided in the post stage of the match amplifier MA for every row. However, the AND gate 26 provided in the sub-arrays such as SA[0, 0] and [1, 0], which are most distant from the priority encoder 30, functions as a buffer by inputting the potential of "H" level (the power supply potential VDD) into one input node. Hereinafter, with reference to FIG. 4 and FIG. 5, the operation of the AND gate 26 is explained taking one entry of the sub-arrays SA[0, 0]-SA[0, 3] as an example.

With reference to FIG. 4 and FIG. 5, first, in each of the sub-arrays SA[0, 0]-SA[0, 3], the corresponding part of the search data inputted via the search-line pairs SL and SL_n and the TCAM cell data are compared. The match amplifier MA of each sub-array SA detects the potential of the corresponding match line ML (when the corresponding part of the input search data and the TCAM cell data match at all points, the potential is at an "H" level, and when they mismatch at least one point, the potential is at an "L" level).

Next, the detection result of the match amplifier MA of the sub-array SA[0, 0] passes through the AND gate 26 employed as a buffer provided in the match amplifier unit of the sub-array[0, 0], and is transferred to the adjacent sub-array SA[0, 1] as a match amplifier output signal mo_0. The AND gate 26 provided in the match amplifier unit 23 of the sub-array SA[0, 1] takes the logical product of the match amplifier output signal mo_0 described above and the detection result of the match amplifier MA of the sub-array SA[0, 1]. The operation result is transferred to the adjacent sub-array SA[0, 2] as a match amplifier output signal mo_1.

Similarly hereinafter, the AND gate 26 provided in the match amplifier unit 23 of the sub-array SA[0, 2] takes the logical product of the match amplifier output signal mo_1 described above and the detection result of the match amplifier MA of the sub-array SA[0, 2]. The operation result is transferred to the adjacent sub-array SA[0, 3] as a match amplifier output signal mo_2. The AND gate 26 provided in the match amplifier unit 23 of the sub-array SA[0, 3] takes the logical product of the match amplifier output signal mo_2 described above and the detection result of the match amplifier MA of the sub-array SA[0, 3]. The operation result is inputted into the priority encoder 30 as a match amplifier output signal mo_3.

[The Configuration of a Data Search System]

Figure 6:
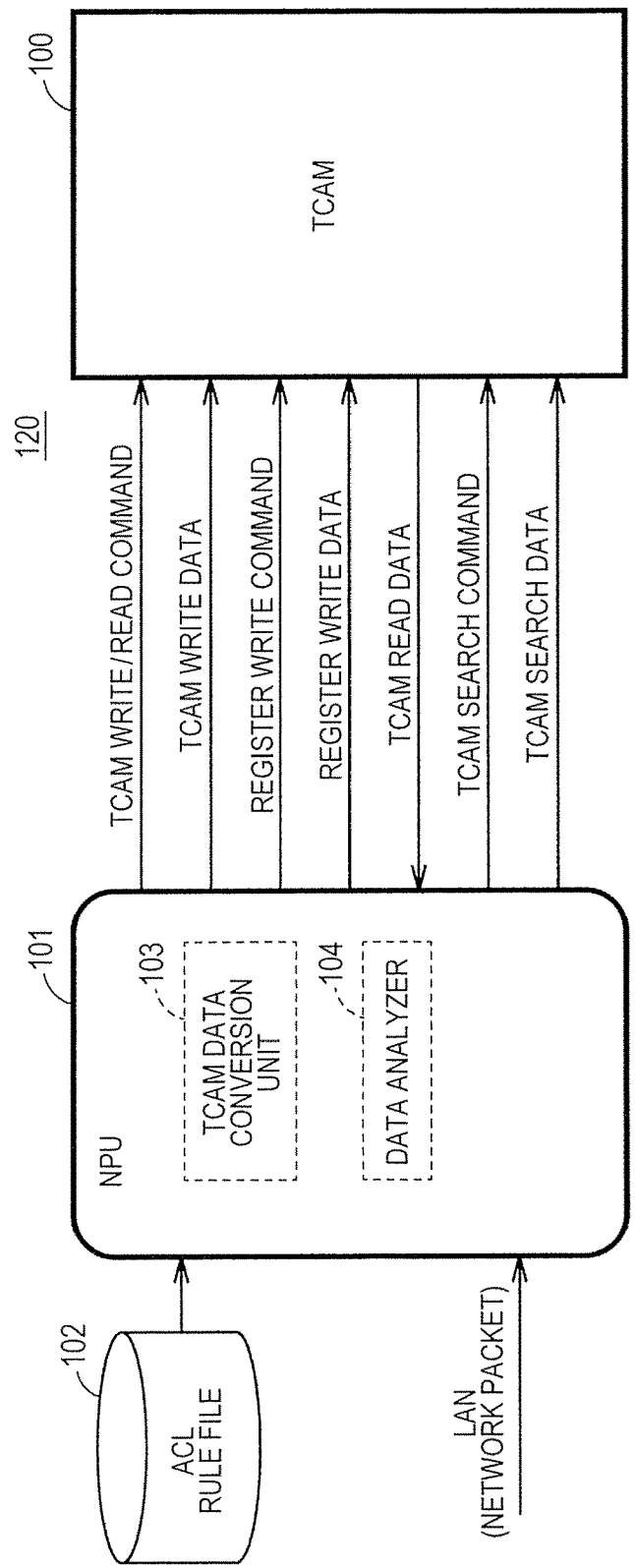
FIG. 6 is a block diagram illustrating the entire configuration of a data search system.

FIG. 6 is a block diagram illustrating the entire configuration of a data search system. The block diagram illustrated in FIG. 6 is the configuration of the data search system 120 provided in a router for networks, such as the Internet.

An ACL (Access Control List) is used for the network system for the purpose of the quality improvement of network traffic and the network security management. An ACL rule file is created by the network administrator and stored in a memory device 102.

The data search system 120 determines immediately whether an inputted network packet via an LAN (Local Area Network) is a packet to be permitted to pass or a packet to be refused to pass, on the basis of the rule described in the ACL. That is, the data search system 120 is required to have the ability to search at high speed for a rule in the ACL which the inputted packet corresponds to, and the processing herein is generally performed by the data search system 120 which uses the TCAM device 100.

Specifically, the data search system 120 includes the TCAM device 100 and an NPU (Network Processor Unit) 101. The NPU 101 is for controlling operation of the TCAM device 100, and outputs various kinds of commands (a write command, a read command, a search command, etc.) and various kinds of data (write data, search data, etc.) to the TCAM device 100. The TCAM device 100 is provided with a control register, and the TCAM device 100 also outputs the command and data for the control register.

In FIG. 6, it is preferable to configure only the TCAM device 100 as one semiconductor device, or it is also preferable to configure the TCAM device 100 and the NPU 101 as one semiconductor device in a combined manner.

The ACL rule file created by the network administrator is converted into the data for the TCAM by a data converter 103 of the NPU 101, and the converted data is stored in the TCAM device. The TCAM device 100 has the ability to compare concurrently the search data based on the IP address, etc. which are included in a network packet, with all the data stored in the TCAM device. However, there is a disadvantage that the search operation of the TCAM generates a large current. In the network system and data search system which are provided with the TCAM device, the issue is how to realize the low power consumption.

[On the Example of the ACL Rule File and the Corresponding TCAM Data]

FIG. 7 is a table illustrating an example of an ACL rule file. FIG. 7 shows only 3 rows of the ACL, however, the ACL rule file is comprised of more rows actually. As illustrated in FIG. 7, the ACL is for checking a protocol number, a destination port number, a source port number, a destination IP address, and a source IP address of a packet inputted from the network. Range specification is possible for these check elements.

For example, the row indicated by the reference symbol 201 in FIG. 7 has the range specification about the source IP address. Specifically, "147.121.56.152/29" is the expression which fixes higher-order 29 bits among 32 bits of the address and uses the remaining 3 bits as a mask (wild card). That is, the range of 147.121.56.152-147.121.56.255 is specified. It is also possible to describe the similar range specification about the destination IP address.

The row indicated by the reference symbol 202 in FIG. 7 has the range specification about the source port number. That is, the expression of "0:65535" specifies the range from 0 to 65535.

The row indicated by the reference symbol 203 in FIG. 7 has the range specification about the destination port number. That is, the expression of "1024:65535" specifies the range from 1024 to 65535.

FIG. 8 is a drawing illustrating an example of the TCAM data obtained by converting the ACL illustrated in FIG. 7.

With reference to FIG. 8, one rule is comprised of 8 bits of the protocol number, 16 bits of the destination port number, 16 bits of the source port number, 32 bits of the destination IP address, and 32 bits of the source IP address, totaling to 104 bits of data. "x" in the drawing indicates don't care data (wild card data). Don't care data is data which matches with both "1" and "0."

The notation of the rows indicated by the reference symbols 201, 202, and 203 in FIG. 8 corresponds to the ACL rule of the rows indicated by the reference symbols 201, 202, and 203 in FIG. 7, respectively. As indicated by the reference symbol 203, the range specification rule (1024-65535) described in one row in the ACL rule may become data described in six rows when converted into the TCAM data. When multiple elements, such as the destination port number and the source port number, are described by use of the range specification rule, the number of rows necessary for the TCAM increases further. For example, when the destination port number and the source port number are described by use of the area specification rule of 1024-65535, the data area of 36 rows is needed for the TCAM device. Accordingly, when many area specification rules are included in the ACL, it is understood that many items of don't care data are included in the TCAM data.

Figure 9:
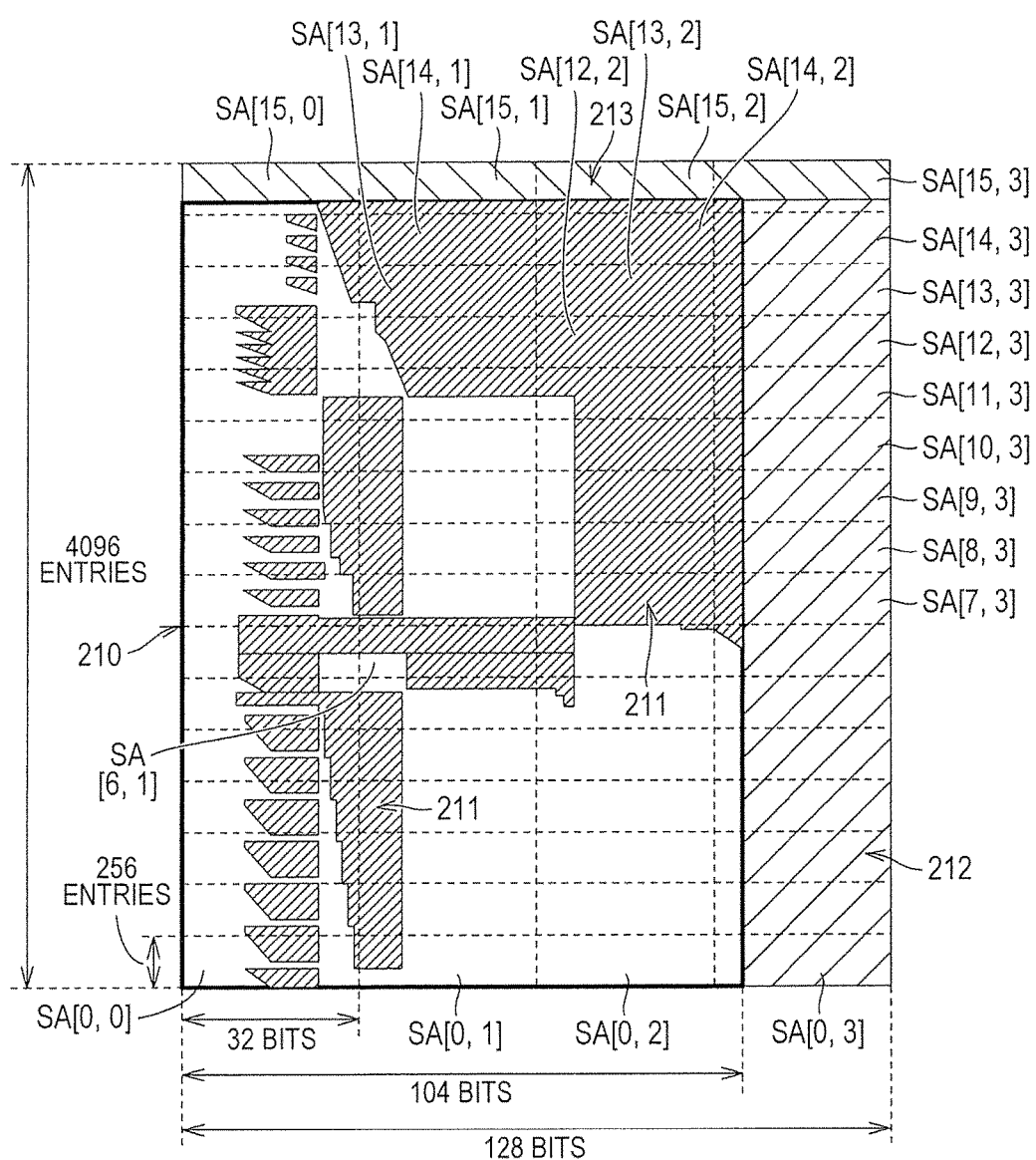
FIG. 9 is a drawing illustrating schematically the memory state of the TCAM device in which the conversion data based on the ACL is written.

FIG. 9 is a drawing illustrating schematically the memory state of the TCAM device in which the conversion data based on ACL is written. FIG. 9 illustrates the state where the ACL rule file with many range specification rules is written in the storage area of the TCAM device.

The TCAM device illustrated in FIG. 9 has a storage area of 4096 entries, and can store data of 128 bits per one entry. The whole TCAM device is divided into a total of 64 sub-arrays SA[0, 0]-SA[15, 3] arranged in 16 rows by 4 columns.

The area 210 surrounded by the heavy line frame in FIG. 9 among the storage areas of the TCAM device is the area where the conversion data based on the ACL is written. The bit width of the area 210 where the data is written is 104 bits, and corresponds to five check elements (8 bits of the protocol number, 16 bits of the destination port number, 16 bits of the source port number, 32 bits of the destination IP address, and 32 bits of the source IP address) explained in FIG. 8. Among the heavy line frame area 210, the area 211 where hatching with oblique lines at narrow intervals is attached indicates the area of don't care data, and the remaining area indicates the area of data "0" and data "1."

To the 104-bit ACL rule, the bit width of the TCAM device is 128 bits; accordingly, the area 212 of a 24 bit width with no data to be written is generated in the TCAM device. Don't care data is stored in the TCAM cell of this area 212.

Furthermore, when the rule numbers are insufficient to 4096 entries as the total number of entries of the TCAM device, there exists a space area 213 of a 128 bit width with no data to be written. This space area is set up as an invalid entry (also called a non-search target entry). The invalid entry area results always in a miss (mismatch) at the time of a search.

Specifically, in the TCAM illustrated in FIG. 9, as for the sub-arrays SA[14, 1], SA[12, 2], SA[13, 2], SA[14, 2], and SA[j, 3] (j=7-14), all the cell data in each sub-array are a don't care; accordingly, the search result of all the rows of these sub-arrays is obvious (all become a hit). As for the sub-arrays SA[15, 1], SA[15, 2], and SA[15, 3] in FIG. 9, each row of the sub-array concerned is comprised of only the cell data of a don't care or it corresponds to an invalid entry; accordingly, the search result of each row of these sub-arrays is obvious. However, in the TCAM in the related art, a search operation is executed to all the sub-arrays when a search command is inputted; accordingly, a search operation is executed also to a sub-array with the obvious search result as described above. For this reason, there has been an issue of consuming electric current in vain.

<Embodiment 1>

In Embodiment 1, the technology is provided in which a normal search result is outputted, while the search operation is stopped in an area with the obvious search result in the TCAM device, specifically in the don't care data area. Accordingly, it is possible to reduce the electric current consumed in vain in the related art technology; accordingly, it is possible to provide the TCAM device with low power consumption and the data search system which employs this TCAM device. Hereinafter, the detailed explanation is made with reference to drawings.

[The Configuration of a Sub-Array]

Figure 10:
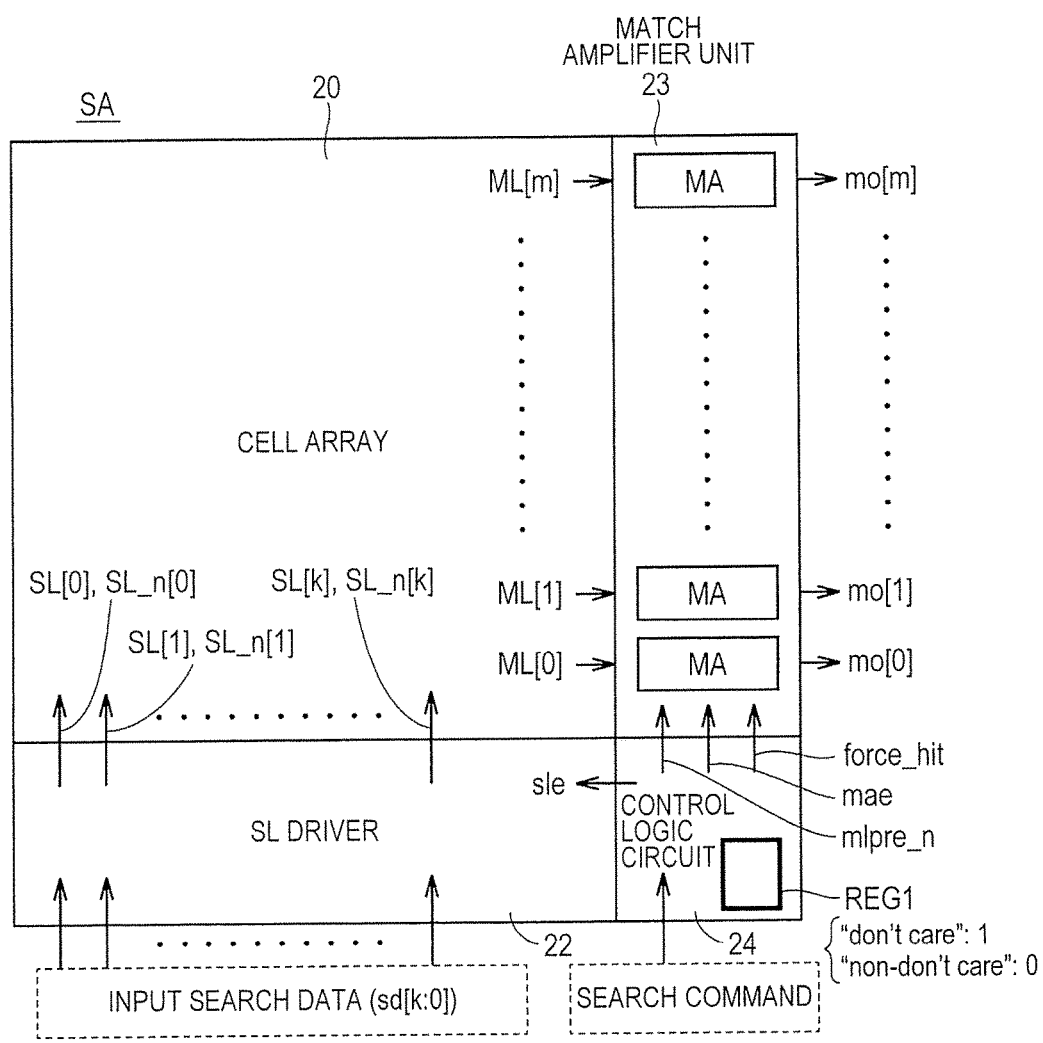
FIG. 10 is a block diagram illustrating the configuration of a sub-array in the TCAM device according to Embodiment 1.

FIG. 10 is a block diagram illustrating the configuration of a sub-array in the TCAM device according to Embodiment 1. With reference to FIG. 10, the sub-array SA illustrated in FIG. 10 is different from the sub-array SA illustrated in FIG. 3, in that a register REG1 is further included. In FIG. 10, the register REG1 is illustrated as provided inside the control logic circuit 24, but it may be provided outside the control logic circuit 24. The configuration of other elements of FIG. 10 is the same as those of FIG. 3. Therefore, the same reference symbol is attached to the same or corresponding element and the repeated explanation thereof is omitted. FIG. 10 shows mainly the portion regarding data search; accordingly the write driver 21 regarding data write is not shown.

The register REG1 is set at a high level "H" (defined as "1" in the present description), when all the data of the TCAM cell array 20 are a don't care, and it is set at a low level "L" (defined as "0" in the present description), when at least one is not a don't care (called "a non-don't care"). Specifically, a dedicated circuit in the TCAM device may analyze whether all the data in the TCAM cell array 20 are a don't care, and the dedicated circuit concerned may set up the value of the register REG1 based on the analysis result. Alternatively, the above-described analysis may be conducted externally (for example, by the data analyzer 104 of the NPU 101 illustrated in FIG. 6), and the analysis result may be written in the register REG1 from the exterior.

The control logic circuit 24 generates control signals (sle, force_hit, mae, and mlpre_n) for controlling the search operation, according to the logical level set in the register REG1. Hereinafter, the detailed explanation is made with reference to FIG. 11-FIG. 15.

[The Configuration of a Search-System Control Circuit]

Figure 11:
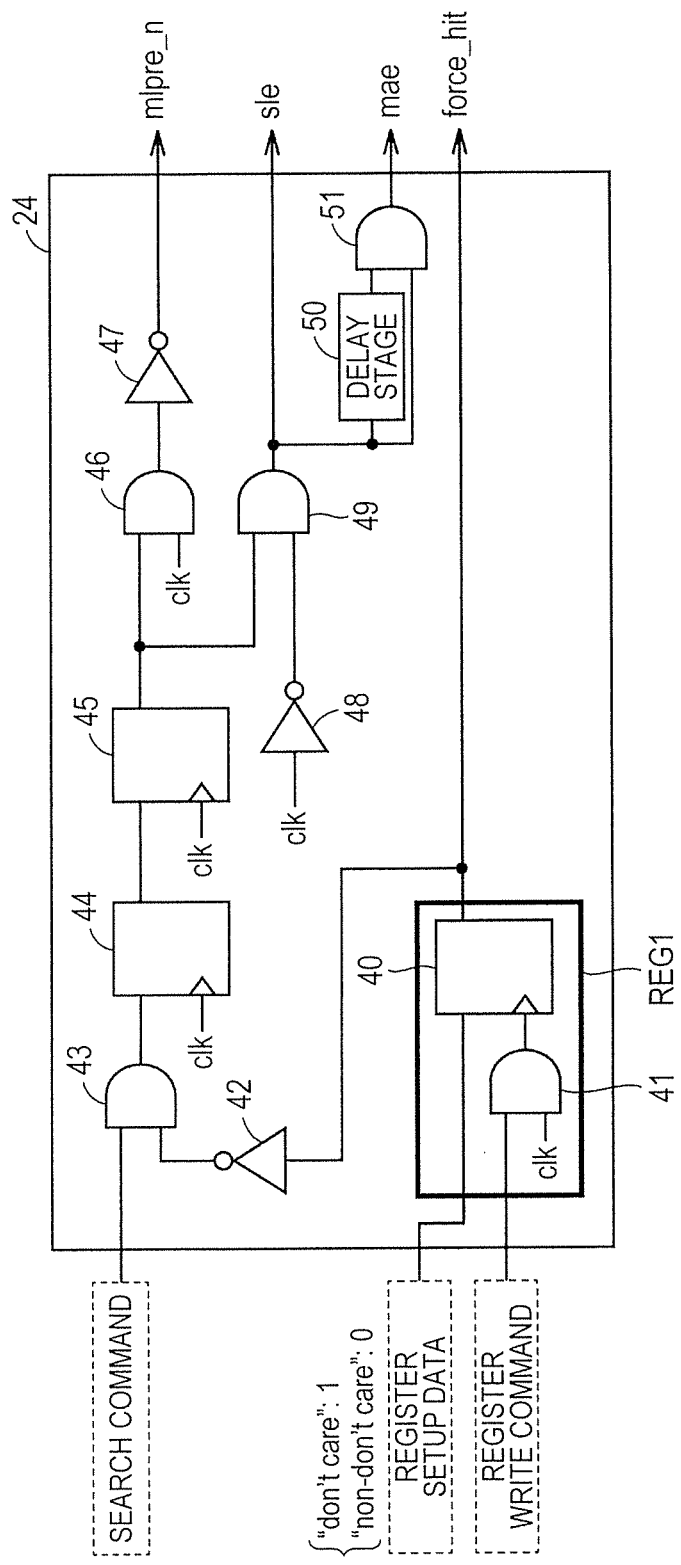
FIG. 11 is a circuit diagram illustrating the configuration of a portion related to a search operation among the control logic circuit illustrated in FIG. 10.

FIG. 11 is a circuit diagram illustrating the configuration of a portion related to a search operation among the control logic circuit illustrated in FIG. 10. With reference to FIG. 10 and FIG. 11, the control logic circuit 24 includes a register REG1, inverters 42, 47, and 48, AND gates 43, 46, 49, and 51, D flip-flops 44 and 45, and a delay stage 50. The register REG1 includes a D flip-flop 40 and an AND gate 41.

When a register write command is activated to an "H" level, the register setup data is written in the D flip-flop 40 at the time of a rising edge of a clock signal clk (that is, when the output of the AND gate 41 becomes an "H" level). When the data of all the cells in the sub-array is a don't care, "1" (an "H" level) is written in the D flip-flop 40, and when it is a non-don't care, "0" (an "L" level) is written in the D flip-flop 40. The register setup data and the register write data are supplied from the exterior of the TCAM device (for example, the NPU 101 illustrated in FIG. 6). The write of the register setup data is performed at the time of activation of the TCAM device, for example.

The output signal of the D flip-flop 40 is inputted into each match amplifier MA of the match amplifier unit 23 as a control signal force_hit. The output of the D flip-flop is also inputted into the AND gate 43 via the inverter 42.

A search command is outputted to the match amplifier unit 23 as a match line precharge signal mlpre_n, passing through the AND gate 43, the flip-flops 44 and 45, the AND gate 46, and the inverter 47 in this order. The control signal force_hit inverted by the inverter 42 is inputted into the other input node of the above-described AND gate 43. The clock signal clk is inputted into the clock terminals of the above-described flip-flops 44 and 45. The clock signal clk is inputted into the other input node of the above-described AND gate 46.

The output signal of the above-described flip-flop 45 is also outputted to the search line driver 22 as a search-line enable signal sle via the AND gate 49. A signal obtained by inverting the clock signal clk with the inverter 48 is inputted into the other input node of the AND gate 49.

The output signal of the above-described AND gate 49 is also inputted into a first input node of the AND gate 51 via the delay stage 50, and concurrently, it is inputted directly into a second input node of the AND gate 51, without passing through the delay stage 50. The output signal of the AND gate 51 is inputted into each match amplifier MA of the match amplifier unit 23 as a match-amplifier enable signal mae.

According to the above-described circuit configuration, depending on the setting value of register REG1, the control signal force_hit becomes an "H" level, when the setting value of the register REG1 is "1", and it becomes an "L" level, when the setting value of the register REG1 is "0." The control signals (sle, mae, and mlpre_n) for search operation control change according to the setting value and the search command of the register REG1.

Specifically, when the stored data of the register REG1 is an "L" (non-don't care), and when the search command is activated to an "H" level, the match line precharge signal mlpre_n is first activated to an "L" level. Next, the search-line enable signal sle is activated to an "H" level. Finally, the match-amplifier enable signal mae is activated to an "H" level.

On the contrary, when the setup data of the register REG1 is an "H" (don't care), even if the search command is activated to an "H" level, the match line precharge signal mlpre_n maintains the "H" level (inactive state), and the search-line enable signal sle maintains the "L" level (inactive state), and the match-amplifier enable signal mae maintains the "L" level (inactive state).

[The Configuration and Operation of the Search Line Driver]

Figure 12:
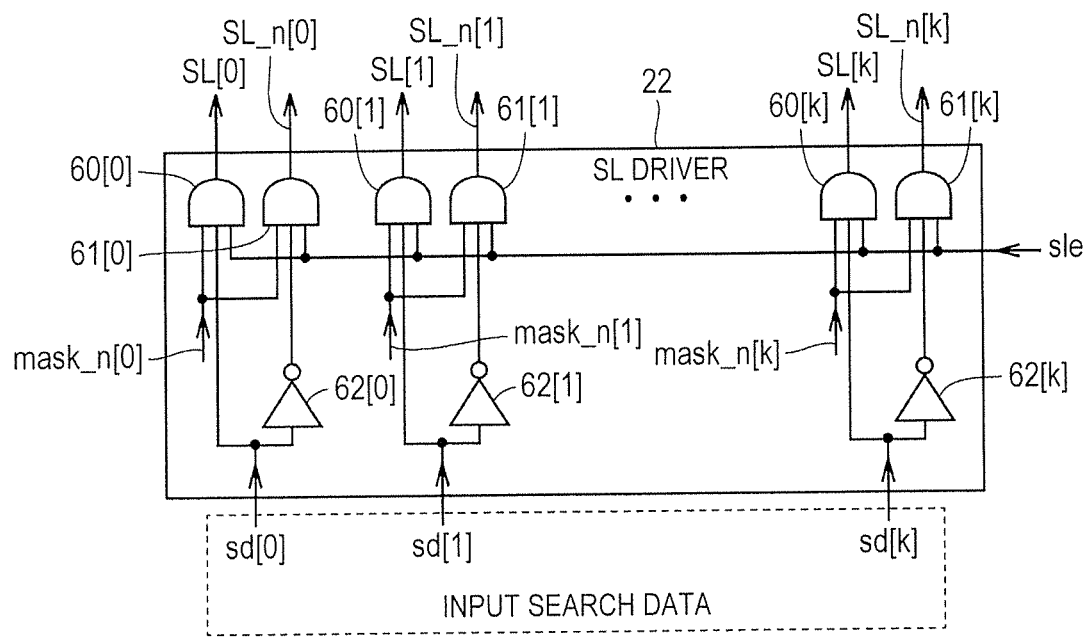
FIG. 12 is a circuit diagram illustrating an example of the configuration of the search line driver illustrated in FIG. 10.

FIG. 12 is a circuit diagram illustrating an example of the configuration of the search line driver illustrated in FIG. 10. With reference to FIG. 10 and FIG. 12, when the search-line enable signal sle is activated to an "H" level, the search line driver 22 outputs the input search data sd[i] (i=0, 1, . . . , k) to the search line SL[i], and concurrently, outputs a signal obtained by inverting the logical level of the input search data sd[i] to the complementary search line SL_n[i].

Specifically, the search line driver 22 includes AND gates 60[0]-60[k] respectively corresponding to the search lines SL[0]-SL[k], AND gates 61[0]-61[k] respectively corresponding to the search lines SL_n[0]-SL_n[k], and inverters 62[0]-62[k]. The search-line enable signal sle is inputted in common to the AND gates 60[0]-60[k] and the AND gates 61[0]-61[k]. The corresponding search data sd[i] and the corresponding mask signal mask_n[i] are inputted into the AND gate 60[i] (i=0, 1, . . . , k). The output signal of the AND gate 60[i] (i=0, 1, . . . , k) is transmitted to the search line SL[i]. A signal obtained by inverting the corresponding search data sd[i], and the corresponding mask signal mask_n[i] are inputted into the AND gate 61[i] (i=0, 1, . . . , k).

According to the above-described configuration, for example, when the search-line enable signal sle is activated to an "H" level, and when the input data sd[i] is at an "H" level ("1"), the voltage of the search line SL[i] becomes an "H" level, and the voltage of the search line SL_n[i] becomes an "L" level. When the search-line enable signal sle is activated to an "H" level, and when the input data sd[i] is at an "L" level ("0"), the voltage of the search line SL[i] becomes an "L" level, and the voltage of the search line SL_n[i] becomes an "H" level. In the case of a mask search (an operation mode of masking the search operation), when a mask signal mask_n[i] (i=0, 1, . . . , k) is activated to an "L" level, the voltage of the search line SL[i] becomes an "L" level, and the voltage of the search line SL_n[i] becomes an "L" level.

[The Configuration and Operation of the Match Amplifier]

Figure 13:
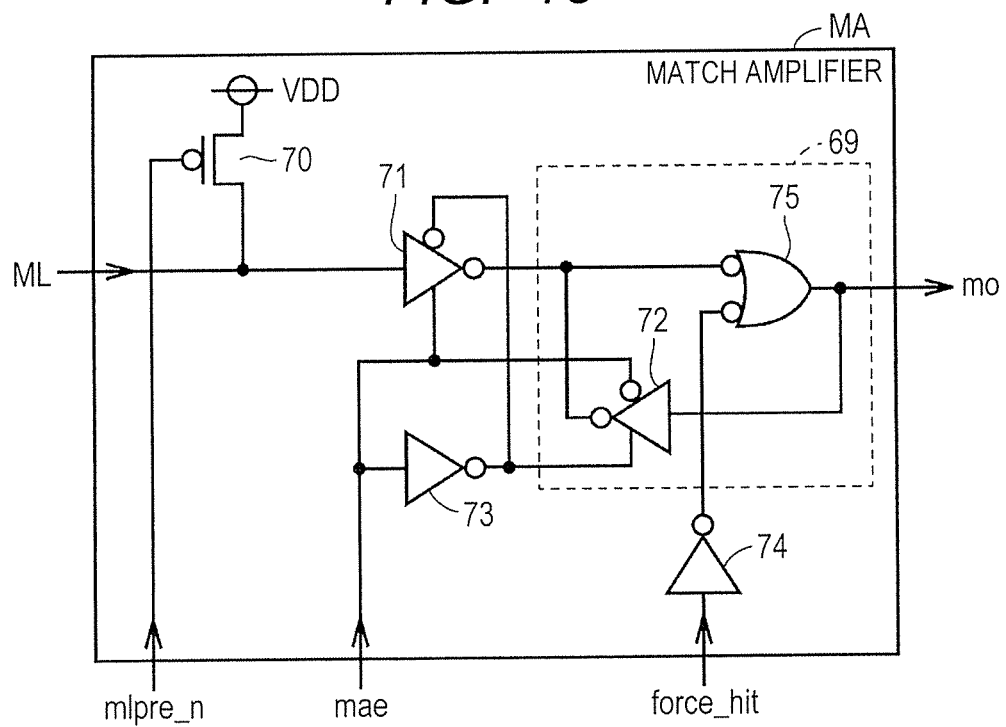
FIG. 13 is a circuit diagram illustrating an example of the configuration of the match amplifier illustrated in FIG. 10.

FIG. 13 is a circuit diagram illustrating an example of the configuration of the match amplifier illustrated in FIG. 10. With reference to FIG. 10 and FIG. 13, the match amplifier MA includes a P-channel MOS transistor 70 as a precharge circuit, inverters 71-74, and the logic gate (NAND gate) 75. In FIG. 13, the MOS transistor 70 as the precharge circuit is shown inside the match amplifier MA; however, the MOS transistor 70 may be provided outside the match amplifier MA.

Hereinafter, the connection of the above-described components is explained. The MOS transistor 70 is coupled between the corresponding match line ML and the power supply node which supplies the power supply potential VDD. The match line precharge signal mlpre_n is inputted into the gate of the MOS transistor 70. The match line ML is further coupled to an input node of the inverter 71. An output node of the inverter 71 is coupled to a first input node of the logic gate 75. The control signal force_hit is inputted into a second input node of the logic gate 75 via the inverter 74. An output node of the logic gate 75 is coupled to the first input node of the logic gate 75 via the inverter 72. The match-amplifier enable signal mae and a signal obtained by inverting its logical level by the inverter 73 are coupled to driving power supply nodes of the inverters 71 and 72. When the match-amplifier enable signal mae is in an inactive state ("L" level), the inverter 71 becomes in a non-operating state, and the inverter 72 becomes in an operating state. When the match-amplifier enable signal mae is in an active state ("H" level), the inverter 71 becomes in an operating state and the inverter 72 becomes in a non-operating state.

Next, the circuit operation of the match amplifier MA illustrated in FIG. 13 is explained. First, (i) the case where the register REG1 of the control logic circuit 24 is set at an "L" level (expressing a non-don't care) is explained. In this case, since the control signal force_hit is at an "L" level, the logic gate 75 functions as an inverter.

First, the match line precharge signal mlpre_n is activated (set to an "L" level), and consequently, the MOS transistor 70 is rendered conductive. Accordingly, the match line ML is charged to the power supply potential VDD (precharged).

The search-line enable signal sle of FIG. 10 is activated (set to an "H" level) after the match line precharge signal mlpre_n is deactivated, and consequently, the search data is inputted into the search-line pairs SL and SL_n. Accordingly, the potential of the match line ML changes depending on the search result (the comparison result of the corresponding part of the input search data and the TCAM cell data). That is, in the case of a match (hit), the potential of the match line ML is maintained at the power supply potential VDD ("H" level), and in the case of a mismatch (miss), the charge of the match line ML is discharged to the ground node; accordingly the potential of the match line ML changes to the ground potential (an "L" level).

Next, the match-amplifier enable signal mae is activated (set to an "H" level). Accordingly, the potential of the match line ML based on the search result is outputted as a match amplifier output signal mo via the inverter 71 and the logic gate 75 (equivalent to an inverter). When the match-amplifier enable signal mae is deactivated (set to an "L" level), the potential of the match line ML based on the search result is held in the latch circuit 69 comprised of the logic gate 75 functioning as an inverter and the inverter 72.

On the other hand, (ii) in the case where the register REG1 is set at an "H" level (expressing a don't care), the control signal force_hit is at an "H" level; accordingly the output signal mo of the match amplifier MA (the output signal of the logic gate 75) is fixed to an "H" level (expressing a match (hit)). Furthermore, in the present case, the match line precharge signal mlpre_n is at an "H" level (inactive state); accordingly, the precharge of the match line ML is not performed. The search-line enable signal sle is at an "L" level (inactive state); accordingly, both the search-line pairs SL and SL_n are fixed to an "L" level (the search line driver 22 does not operate). The match-amplifier enable signal mae is at an "L" level (inactive state); accordingly, the inverter 71 is in a non-operating state.

[An Example of the Search Operation]

Hereinafter, an example of the search operation in one certain sub-array is explained with reference to the timing charts illustrated in FIG. 14 and FIG. 15.

(A case where "0" is stored in the register REG1)

Figure 14:
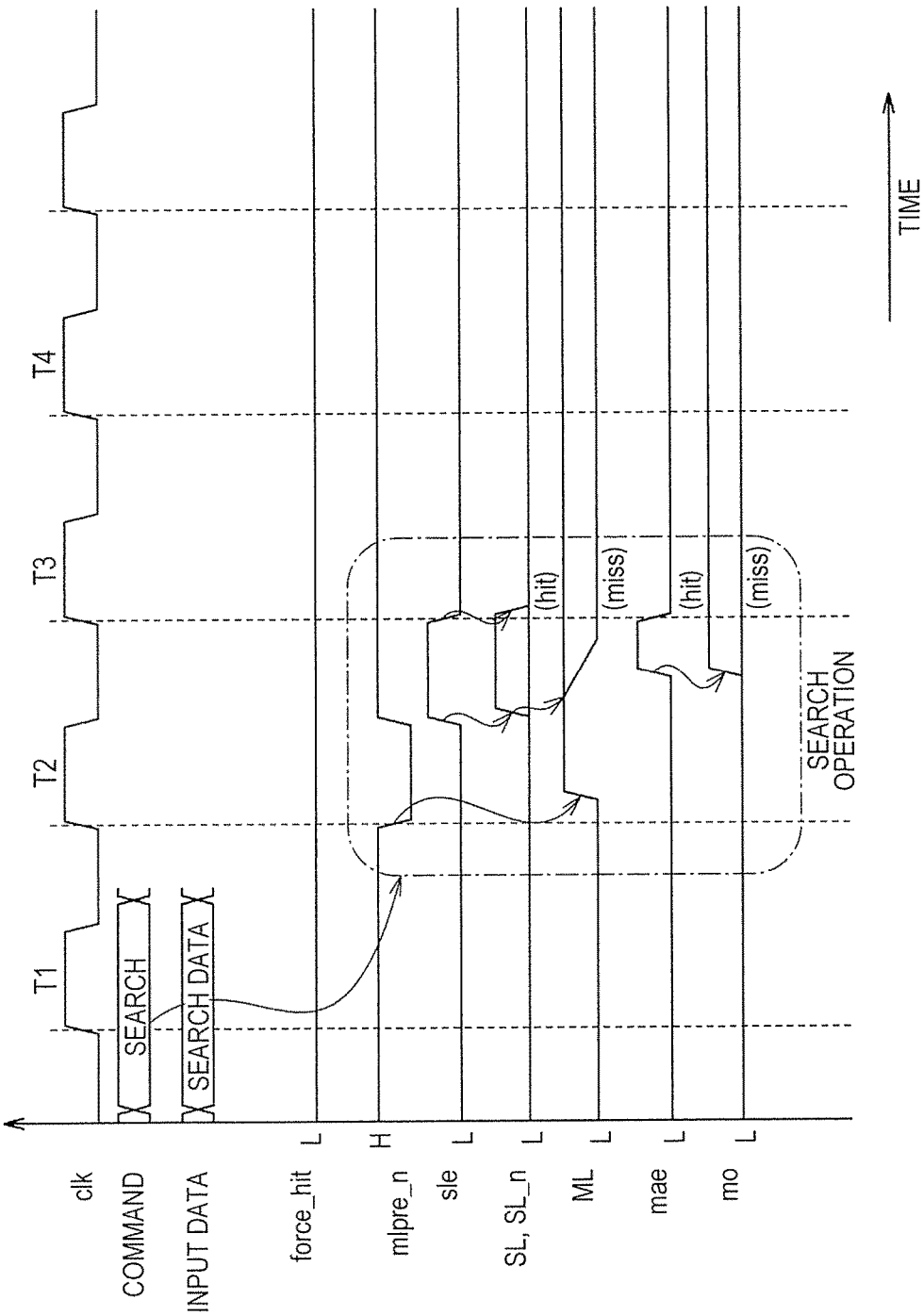
FIG. 14 is a timing chart illustrating a search operation when data "0" expressing a non-don't care is stored in a register REG1 provided in the sub-array illustrated in FIG. 10.

FIG. 14 is a timing chart illustrating a search operation when data "0" expressing a non-don't care is stored in the register REG1 provided in the sub-array illustrated in FIG. 10. In FIG. 14, a cycle is a period from a positive edge of a clock signal clk to the following positive edge. A control signal force_hit outputted from the control logic circuit 24 is at an "L" level.

With reference to FIG. 14, in the neighborhood of changing to a cycle T1 (from the second half of a cycle immediately before the cycle T1 toward the first half of the cycle T1), a search command and search data are inputted into the TCAM device. At the first rising of the clock signal clk in the cycle T1, the search command and the search data are fetched into the control logic circuit 24. Responding to this search command, the control logic circuit 24 activates (sets to an "L" level) the match line precharge signal mlpre_n in the first half of the following cycle T2. Accordingly, the match line ML is charged to the power supply potential VDD (precharged).

Responding to the search command, the control logic circuit 24 activates (sets to an "H" level) the search-line enable signal sle in the second half of the cycle T2. Before the search-line enable signal sle is activated, the match line precharge signal mlpre_n is deactivated (set to an "H" level). Due to the activation of the search-line enable signal sle, the search line driver 22 is activated to transfer the search data sd to the search-line pairs SL and SL_n. As a result, when the cell data of all the TCAM cells coupled to the match line ML match (hit) with the search data sd transferred via the search-line pairs SL and SL_n, the potential of the match line ML is maintained at the power supply potential VDD (an "H" level). When at least one of the stored values of the TCAM cells coupled to the match line ML does not match with the transferred search data sd (miss), the charge precharged at the match line ML is discharged; accordingly, the potential of the match line ML changes to the ground potential (an "L" level).

Responding to the search command, in the second half of the cycle T2, after activating the search-line enable signal sle and before deactivating it, the control logic circuit 24 activates (sets to an "H" level) the match-amplifier enable signal mae. Accordingly, in every row (entry), a signal based on the potential of the match line ML (search result) is outputted from the match amplifier MA. The search result in the multiple sub-arrays (match amplifiers MA) corresponding to the same entry is processed in an AND operation and then is inputted into the priority encoder 30.

In the following cycle T3, when the control logic circuit 24 deactivates (sets to an "L" level) the match-amplifier enable signal mae, the search result detected in each match line ML is held in the latch circuit 69 in the corresponding match amplifier MA. Furthermore, in the cycle T3, the priority encoder 30 outputs a hit address (search result). When multiple hit addresses exist, the hit address which has the highest priority is outputted.

(A case where "1" is stored in the register REG1)

Figure 15:
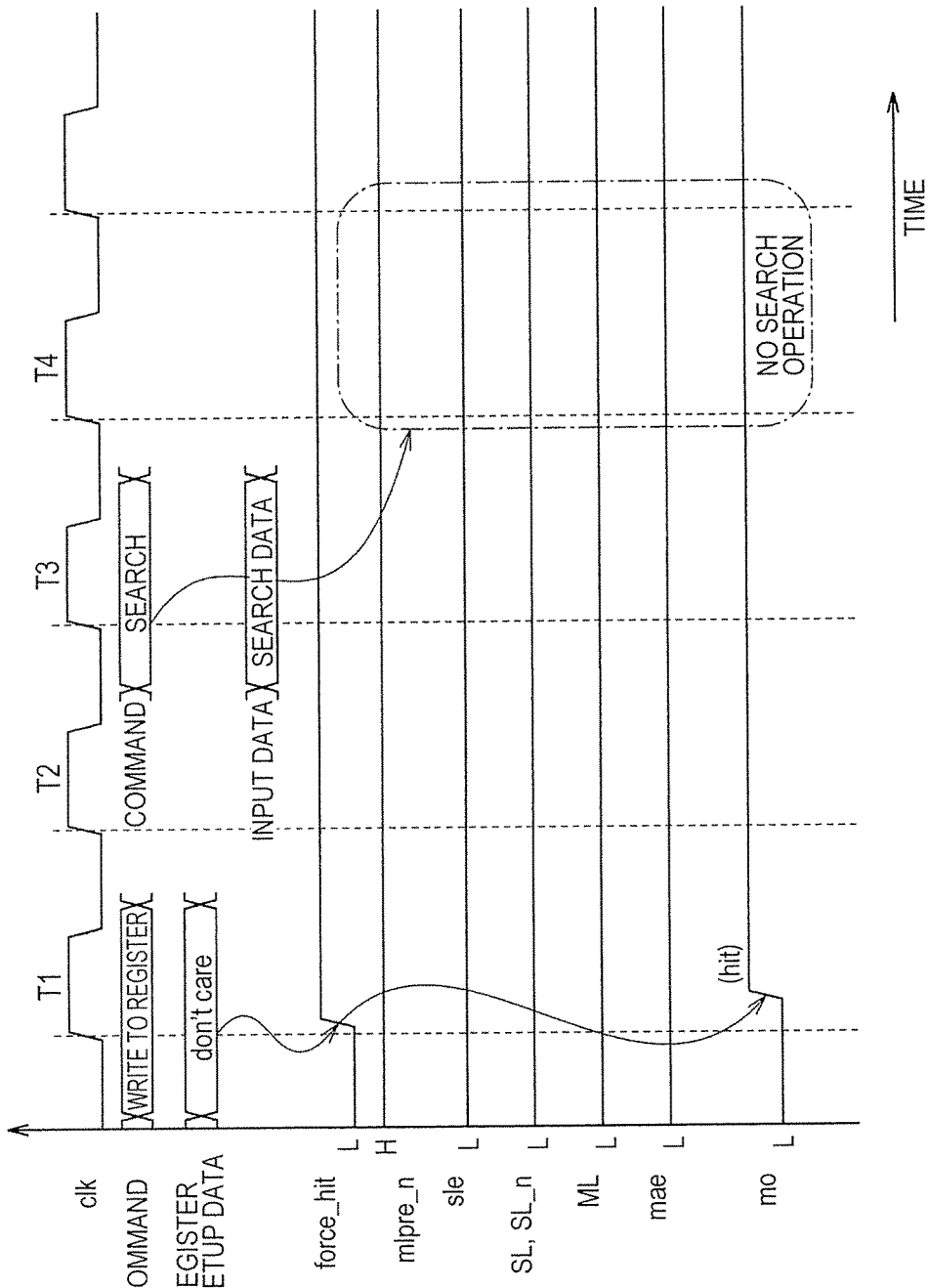
FIG. 15 is a timing chart illustrating a search operation when data "1" expressing a don't care is stored in the register REG1 provided in the sub-array illustrated in FIG. 10.

FIG. 15 is a timing chart illustrating a search operation when data "1" expressing a don't care is stored in the register REG1 provided in the sub-array illustrated in FIG. 10.

With reference to FIG. 15, at the time of power supply starting, etc., at first (in FIG. 15, from the second half of a cycle immediately before the cycle T1 toward the first half of the cycle T1), a register write command and register setup data (an "H" level) indicating a don't care are inputted into the TCAM device. At the first rising of the clock signal clk in the cycle T1, the register setup data (an "H" level) is written in the register REG1 of the corresponding sub-array SA. Accordingly, the control signal force_hit is set to an "H" level, and the output signal mo of each match amplifier MA is fixed to an "H" level (expressing a hit).

In the search operation, at first (in FIG. 15, from the second half of the cycle T2 towards the first half of the cycle T3), a search command and search data are inputted into the TCAM device. When an "L" level is set in the register REG1, at the first rising of the clock signal clk in the cycle T3, the search command is fetched into the control logic circuit 24, and in the following cycle T4, the search operation is executed (refer to FIG. 14). However, when an "H" level is set in the register REG1, the search command is not fetched into the control logic circuit 24. Therefore, the search operation is not started in the following cycle T4.

In this way, when the cell data of all the TCAM cells of one certain sub-array expresses a don't care, the register REG1 is set at an "H" level ("1"). As a result, the output of each match amplifier MA of the sub-array concerned is fixed to an "H" level (hit), and the search operation (the precharge of the match line and the operation of the search line driver) is not executed in the sub-array concerned. Therefore, it is possible to attain the power saving.

[A Modified Example of the Configuration of the Match Amplifier]

For example, the sub-arrays SA[15, 1], SA[15, 2], and SA[15, 3] of the TCAM device illustrated in FIG. 9 include the invalid entry in which data is not stored. That is, in each row of these sub-arrays, all the cell data are set as a don't care, or correspond to an invalid entry. Accordingly, the search result of each row (entry) is obvious. In such a case, it is possible to attain the low power consumption, by setting the register REG1 in the control logic circuit 24 of FIG. 10 to an "H" level ("1"), in order not to perform the search operation in the sub-array concerned. However, regarding the row which corresponds to an invalid entry among these sub-arrays, it is necessary to make a change so that the match amplifier MA outputs an "L" level (miss) as the search result.

The following explains the configuration of the match amplifier MA which is changed so as to output a miss as the search result in the case of an invalid entry, as described above. As explained in FIG. 9, the invalid entry designates the vacant entry in which data is not stored among the total entries of the TCAM device, and it is a non-search target entry. On the other hand, the valid entry is a search target entry in which data is stored among all the entries of the TCAM device.

Figure 16:
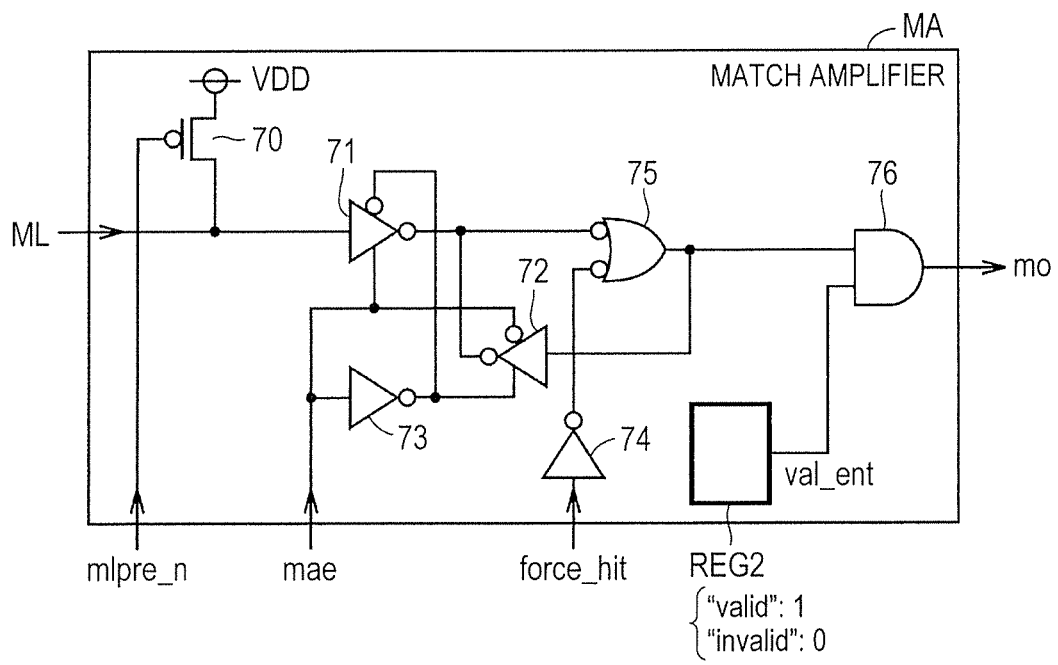
FIG. 16 is a circuit diagram illustrating a modified example of the match amplifier illustrated in FIG. 10.

FIG. 16 is a circuit diagram illustrating a modified example of the match amplifier illustrated in FIG. 10. The match amplifier MA illustrated in FIG. 16 is different from the match amplifier illustrated in FIG. 10 in that an AND gate 76 and a register REG2 are further included. The register REG2 is set at an "L" level (defined as "0" in the present description) when the corresponding row (entry) of the sub-array is an invalid entry, and is set at an "H" level (defined as "1" in the present description) when the corresponding row (entry) is a valid entry. The register REG2 is necessary only to be provided corresponding to the match amplifier MA for every row of the sub-array SA; accordingly, the register REG2 does not necessarily need to be provided inside the match amplifier MA as illustrated in FIG. 16. The above-described setup of the value of the register REG2 may be performed by a dedicated circuit provided inside the TCAM device or may be performed from the exterior of the TCAM device (for example, the NPU 101 illustrated in FIG. 6).

The AND gate 76 outputs the AND operation result of a control signal val_ent outputted from the register REG2 and an output signal of the logic gate 75, as the output signal mo of the match amplifier MA. The configuration of other elements of FIG. 16 is the same as those of FIG. 10; therefore, the same reference symbol is attached to the same or corresponding element and the repeated explanation thereof is omitted.

According to the configuration described above, even when the register REG1 explained in FIG. 10 and FIG. 11 is set at an "H" level ("1") indicating a don't care, it is possible to set the output signal mo of the match amplifier MA at an "L" level (miss), by setting the register REG2 of the match amplifier MA corresponding to an invalid entry as the value of the "L" level ("0"). Therefore, when each row of a certain sub-array is entirely comprised of the cell data of a don't care or corresponds to an invalid entry and does not include the TCAM cell storing data of "1" or "0", it is possible to stop the search operation in the sub-array concerned, and to output normally a hit (in the case of a don't care) or a miss (in the case of an invalid entry) from each match amplifier MA. As a result, it is possible to reduce the power consumption of the sub-array concerned.

[The Effect of Embodiment 1]

According to the above-described embodiment, it is possible to control not to perform the search operation to the sub-array with the obvious search result and to output the normal search result from the sub-array concerned. Specifically, when the data of all the TCAM cells included in the sub-array is a don't care, a signal of an "H" level denoting a hit is outputted from each match amplifier MA. When each row of the sub-array concerned is entirely comprised of the cell data of a don't care or it corresponds to an invalid entry, a signal of an "H" level denoting a hit is outputted from the match amplifier MA corresponding to the case of a don't care, and a signal of an "L" level denoting a miss is outputted from the match amplifier corresponding to the case of an invalid entry. As a result, each match amplifier MA of the sub-array concerned does not generate the precharge current of the match line and the operating current. Therefore, it is possible to reduce the power consumption of the TCAM device.

Furthermore, by not performing the search operation to the sub-array with the obvious search result, it is possible to reduce the peak current at the time of the search operation and to suppress a rapid current change. Furthermore, owing to the suppression of the rapid current change, it is possible to reduce the fluctuation of the supply voltage supplied to the semiconductor chip which mounts the TCAM device. As a result, it is possible to realize the high-quality TCAM device with the stable search property. Furthermore, owing to the reduction of the consumption current of the TCAM device and the peak current at the time of the search operation, it is possible to mitigate the required capacity (such as the supply capacity of electric current and the response performance) of the external power device coupled to the TCAM device. Therefore, it is possible to realize an inexpensive and high-quality data search system.

<Embodiment 2>

[The Configuration of a TCAM Sub-Array]

Figure 17:
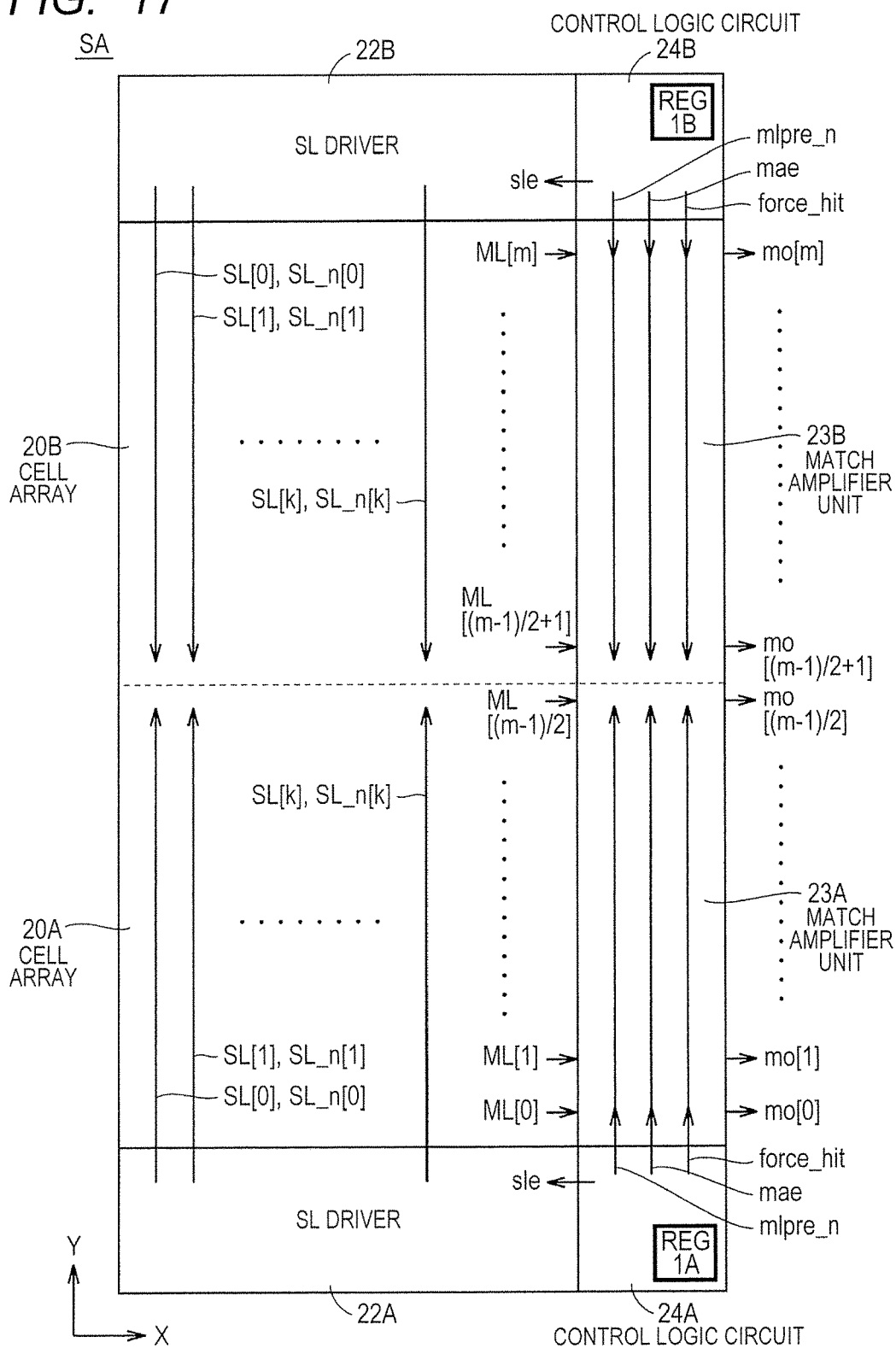
FIG. 17 is a block diagram illustrating the configuration of a sub-array SA in a TCAM device according to Embodiment 2.

FIG. 17 is a block diagram illustrating the configuration of a sub-array SA in a TCAM device according to Embodiment 2. The sub-array SA illustrated in FIG. 17 is different from the sub-array SA illustrated in FIG. 10 in that two control logic circuits 24A and 24B arranged at both ends in the column direction (Y direction) and two search line drivers 22A and 22B arranged at both ends in the column direction (Y direction) are included. Although not shown in FIG. 17, the write drivers are also arranged to both ends in the column direction (Y direction).

The TCAM cells from the 0-th row to the (m−1)/2-th row (called a cell array 20A) are controlled by an SL driver 22A, a match amplifier unit 23A, and a control logic circuit 24A which adjoin these TCAM cells (the cell array 20A).

When the cell array 20A stores only the data of a don't care, the value of an "H" level ("1") is set at a register REG1A provided in the control logic circuit 24A. In this case, the control signal force_hit outputted from the control logic circuit 24A becomes an "H" level ("1"). Therefore, the output signals mo[0]–mo[(m−1)/2] from the match amplifiers (not shown) provided in the match amplifier unit 23A are fixed at an "H" level (hit).

The TCAM cells from the ((m−1)/2+1)-th row to the m-th row (called a cell array 20B) are controlled by an SL driver 22B, a match amplifier unit 23B, and a control logic circuit 24B which adjoin these TCAM cells (the cell array 20B).

When the cell array 20B stores only the data of a don't care, the value of an "H" level ("1") is set at a register REG1B provided in the control logic circuit 24B. In this case, the control signal force_hit outputted from the control logic circuit 24B becomes an "H" level ("1"). Therefore, the output signals mo[(m−1)/2+1]–mo[m] from the match amplifiers (not shown) provided in the match amplifier unit 23B are fixed at an "H" level (hit).

Each match amplifier (not shown) provided in the match amplifier units 23A and 23B of the sub-array SA illustrated in FIG. 17 may have the configuration of the match amplifier MA which has the register REG2 explained in FIG. 16. In this case, the output signal mo from the match amplifier of the row corresponding to an invalid entry among the cell arrays 20A and 20B of the sub-array SA becomes an "L" level (miss).

The other elements of FIG. 17 are the same as those of Embodiment 1 such as illustrated in FIG. 10. Therefore, the same reference symbol is attached to the same or corresponding element and the repeated explanation thereof is omitted.

[The Effect of Embodiment 1]

According to the TCAM device including the sub-array of the above-described configuration, the same effect as in the TCAM device according to Embodiment 1 is produced, and still the following effects are produced. First, compared with the sub-array of the configuration illustrated in FIG. 10 of Embodiment 1, it is possible to perform a setup indicating whether the area of half of the total number of entries (rows) is a don't-care area or not. Accordingly, it is also possible to attain the power saving to the ACL rule file having a comparatively small don't-care area.

When multiple sub-arrays SA of the configuration illustrated in FIG. 10 are arranged, it is necessary to provide a certain amount of interval between neighboring sub-arrays SA so that the driver circuits, such as the search line driver 22, and the cell arrays 20A may not approach too close, because of the restrictions of the design rule. As compared with this, when the multiple sub-arrays SA of the configuration illustrated in FIG. 17 are arranged, it is possible to arrange the search line driver 22A and the control logic circuit 24A of each sub-array SA in close vicinity to the search line driver 22B and the control logic circuit 24B of the neighboring sub-array SA. Therefore, there is an advantage that it is not necessary to enlarge the interval between the neighboring sub-arrays as in the case of FIG. 10.

<Embodiment 3>

For example, as for the sub-arrays SA[6, 1] and SA[13, 1] illustrated in FIG. 9, the TCAM cell of all the rows in the sub-array is not set as a don't care. Therefore, it is not possible to set the register REG1 explained in FIG. 10 and FIG. 11 at an "H" level ("1"). However, all the TCAM cells of some rows are set as a don't care. Therefore, as for these rows, it is obvious that the search result becomes a hit.

Therefore, a TCAM device according to Embodiment 3 can control to stop the precharge of the match line ML and to stop the circuit operation of the match amplifier MA, for every row of a sub-array. Accordingly, it is possible to attain the further power saving. Hereinafter, the detailed explanation is made with reference to drawings.

[The Configuration and Operation of the Match Amplifier]

Figure 18:
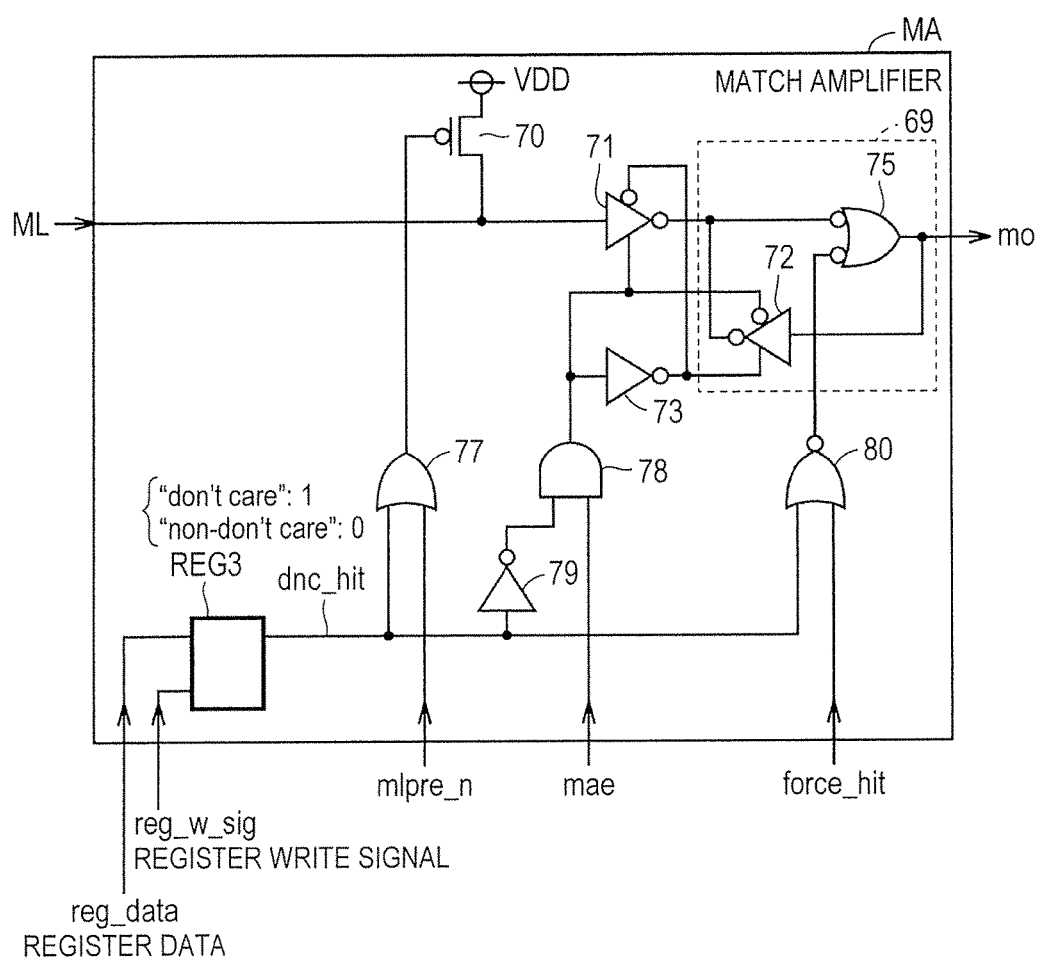
FIG. 18 is a circuit diagram illustrating the configuration of a match amplifier MA in a TCAM device according to Embodiment 3.

FIG. 18 is a circuit diagram illustrating the configuration of a match amplifier MA in a TCAM device according to Embodiment 3. The match amplifier MA illustrated in FIG. 18 is different from the match amplifier MA illustrated in FIG. 13 in that a register REG3, an OR gate 77, an AND gate 78, and an inverter 79 are further included. Furthermore, the match amplifier MA illustrated in FIG. 18 is different from the match amplifier MA illustrated in FIG. 13 in that an NOR gate 80 is included in place of the inverter 74.

When the cell data of all the TCAM cells coupled to the match amplifier MA via the match line ML are set as a don't care, the register REG3 is set at an "H" level (defined as "1" in the present description). When at least one cell data is not a don't care among the TCAM cells coupled to the match amplifier MA via the match line ML, the register REG3 is set at an "L" level (defined as "0" in the present description). The register REG3 is necessary only to be provided corresponding to the match amplifier MA for every row of the sub-array SA; accordingly, the register REG3 does not necessarily need to be provided inside the match amplifier MA as illustrated in FIG. 18.

The OR gate 77 performs the OR operation of a control signal dnc_hit outputted from register REG3 and the match line precharge signal mlpre_n, and outputs an operation result to the gate of the P-channel MOS transistor 70. Accordingly, when the control signal dnc_hit which follows the setting value of the register REG3 is at an "H" level, the MOS transistor 70 is fixed to an OFF state. Therefore, precharge of the match line ML does not take place.

The AND gate 78 performs the AND operation of the match-amplifier enable signal mae and a value obtained by inverting the logical level of the control signal dnc_hit outputted from the register REG3 with the inverter 79. The AND operation result of the AND gate 78 and a signal obtained by inverting the logical level of this AND operation result with the inverter 73 are supplied to the driving power supply nodes of the inverters 71 and 72. Accordingly, when the control signal dnc_hit which follows the setting value of the register REG3 is at an "H" level, the inverter 71 is brought in a non-operating state, and the inverter 72 is brought in an operating state. Therefore, the potential of the match line ML is not outputted to the subsequent-stage circuit, and the potential of the match line ML is not latched.

The NOR gate 80 performs the NOR operation of the control signal dnc_hit outputted from the register REG3 and the control signal force_hit, and inputs the operation result into the second input node of the logic gate 75 (NAND gate). Accordingly, when the register REG3 (the control signal dnc_hit) is set at an "H" level, the output signal mo of the match amplifier MA (the output signal of the logic gate 75) is fixed to an "H" level (expressing a match (hit)).

As described above, when the register REG3 (the control signal dnc_hit) is set at an "H" level, it is possible to fix the output signal mo of the match amplifier MA at an "H" level (hit) and to stop the precharge of the match line ML and the circuit operation of the match amplifier MA, even when the register REG1 is set at an "L" level.

The other configuration and operation of FIG. 18 are the same as those of FIG. 13. Accordingly, The same reference symbol is attached to the same or corresponding element and the repeated explanation thereof is omitted. For example, when the register REG1 provided in the control logic circuit 24 and the register REG3 provided in the match amplifier MA are both set at an "L" level (expressing a non-don't care), the ordinary search operation is performed to the TCAM cell coupled to the match line ML via the match amplifier MA. When the register REG1 provided in the control logic circuit 24 is set at an "H" level (expressing a don't care), the search operation of the whole sub-array is stopped.

[A Data Setting Method of the Register REG3]

Hereinafter, the data setting method of the register REG3 is explained with reference to FIG. 18-FIG. 21.

As illustrated in FIG. 18, a register write signal reg_w_sig and register data reg_data are inputted into the register REG3. The register REG3 stores the register data reg_data when the register write signal reg_w_sig is activated. The register write signal reg_w_sig and the register data reg_data may be supplied from the dedicated circuit inside the TCAM device, or may be supplied from a processor in the exterior of the TCAM device (for example, the NPU 101 illustrated in FIG. 6).

In particular, when the dedicated circuit (a data determination circuit 33 illustrated in FIG. 19) is provided inside the TCAM device, it is convenient that the dedicated circuit concerned can determine at the time of the data write to the TCAM device whether the write data to all the TCAM cells coupled to the common match line ML is a don't care and can perform immediately the write to the register REG3 based on the determination result. When all the TCAM cells coupled to the common match line ML are set as a don't care, the dedicated circuit concerned sets the register REG3 at an "H" level ("1"), otherwise the dedicated circuit concerned sets the register REG3 at an "L" level ("0").

As opposed to this, when the register REG3 is set up by the processor outside the TCAM device, after the data write to the TCAM device, the external processor reads data from the TCAM device for every entry and determines whether the above-described determination condition is satisfied. Accordingly, it takes time more than providing the dedicated circuit inside the TCAM device.

Hereinafter, the operation of the above-described dedicated circuit (the data determination circuit 33 illustrated in FIG. 19) is explained in detail with reference to drawings.

Figure 19:
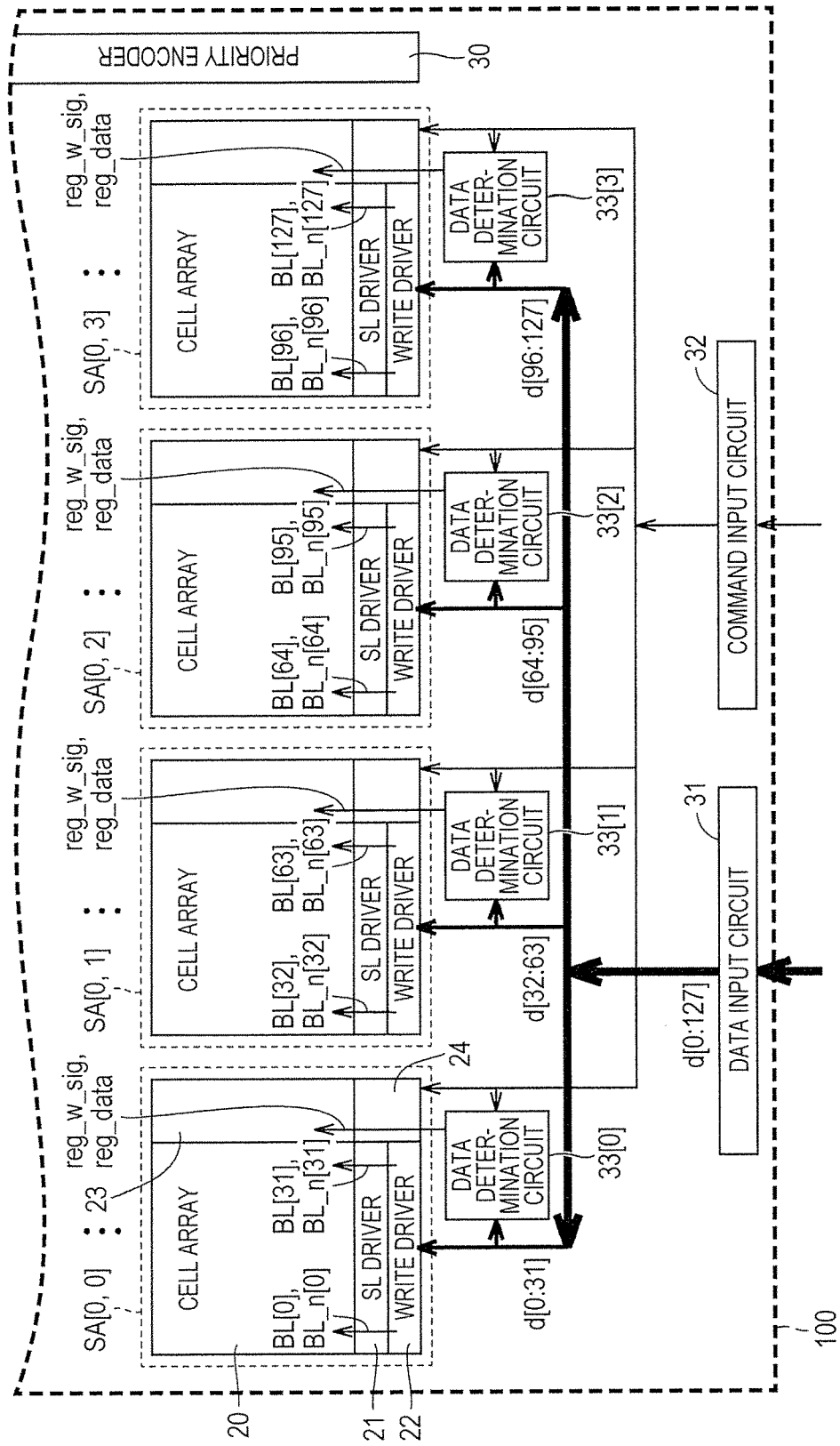
FIG. 19 is a block diagram illustrating the configuration of the TCAM device according to Embodiment 3.

FIG. 19 is a block diagram illustrating the configuration of a TCAM device according to Embodiment 3. The TCAM device illustrated in FIG. 19 is different from the TCAM device illustrated in FIG. 4 in that data determination circuits 33[0]-33[3] (described as the data determination circuit 33 when calling collectively or when indicating unspecified one) are further included.

As illustrated in FIG. 19, the data determination circuit 33[0] is provided corresponding to the sub-arrays SA[0, 0], SA[1, 0], SA[2, 0], and . . . . When the write command inputted via the command input circuit 32 is detected, the data determination circuit 33[0] determines whether the conditions that all the write data of the same row (entry) are a don't care are satisfied, based on write data d[0:31] to be written to the corresponding sub-array. The data determination circuit 33[0] sets the register REG3 corresponding to the row concerned at an "H" level (expressing a don't care), when the above-described determination condition is satisfied.

Similarly, the data determination circuit 33[1] is provided corresponding to the sub-arrays SA[0, 1], SA[1, 1], SA[2, 1], and . . . , and sets each register REG3 of the corresponding sub-array, based on write data d[32:63] to the corresponding sub-array. The data determination circuit 33[2] is provided corresponding to the sub-arrays SA[0, 2], SA[1, 2], SA[2, 2], and . . . , and sets each register REG3 of the corresponding sub-array, based on write data d[64:95] to the corresponding sub-array. The data determination circuit 33[3] is provided corresponding to the sub-arrays SA[0, 3], SA[1, 3], SA[2, 3], and . . . , and sets each register REG3 of the corresponding sub-array, based on write data d[96:127] to the corresponding sub-array.

Figure 20:
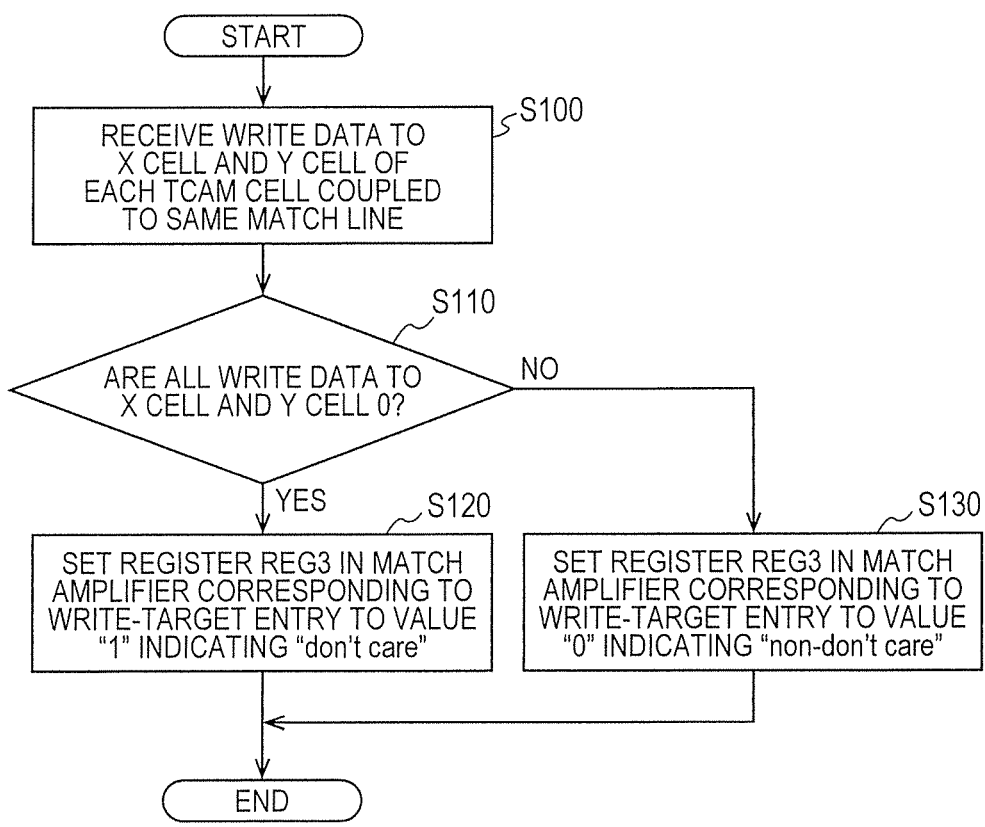
FIG. 20 is a flow chart illustrating an operation of a data determination circuit 33 illustrated in FIG. 19.

FIG. 20 is a flow chart illustrating an operation of the data determination circuit 33 illustrated in FIG. 19. With reference to FIG. 19 and FIG. 20, at the time of data write to the TCAM cell, the data input circuit 31 outputs the write data for the X cell of each TCAM cell (refer to FIG. 1) for every entry, and subsequently, outputs the write data for the Y cell. The write data d[0:31], d[32:63], d[64:95], and d[96:127] for the X cell and for Y cell sequentially outputted from the data input circuit 31 are supplied to the write driver 21 of the corresponding sub-array SA in units of 32 bits, and outputted to each bit-line pairs BL and BL_n from the write driver 21. The write data d[0:31], d[32:63], d[64:95], and d[96:127] for the X cell and for the Y cell are inputted into the corresponding data determination circuit 33 in units of 32 bits. When expressed in another way, the data determination circuit 33 receives sequentially the write data for the X cell and the Y cell of the write-target TCAM cell coupled to the same match line (Step S100).

Subsequently, the data determination circuit 33 determines whether the received write data satisfies the conditions that all the bits of the received write data of 32 bits for the X cell and all the bits of the write data of 32 bits for the Y cell are "0" (Step S110). Specifically, the data determination circuit 33 performs the OR operation of all the bits of the write data for the X cell, and further performs the OR operation of all the bits of the write data for the Y cell. The data determination circuit 33 performs the NOR operation of the operation result of these OR operations, and determines whether the value finally obtained is "1" (don't care) or "0" (non-don't care).

When the determination condition that all the bits of the above-described X-cell data and Y-cell data are "0" is satisfied, that is, when the value finally obtained by the above-described logical operation is "1" (don't care) (YES at Step S110), the data determination circuit 33 sets the register REG3 corresponding to the entry of the write target as a value "1" (an "H" level) indicating a don't care (Step S120). The timing at which a value "1" is set to the register REG3 may be the same as the timing at which data is written in the TCAM cell.

On the contrary, when the above-described determination condition is not satisfied, that is, when the value finally obtained by the above-described logical operation is "0" (non-don't care) (No at Step S110), the data determination circuit 33 sets the register REG3 corresponding to the entry of the write target as a value "0" (an "L" level) indicating a non-don't care (Step S130).

Figure 21:
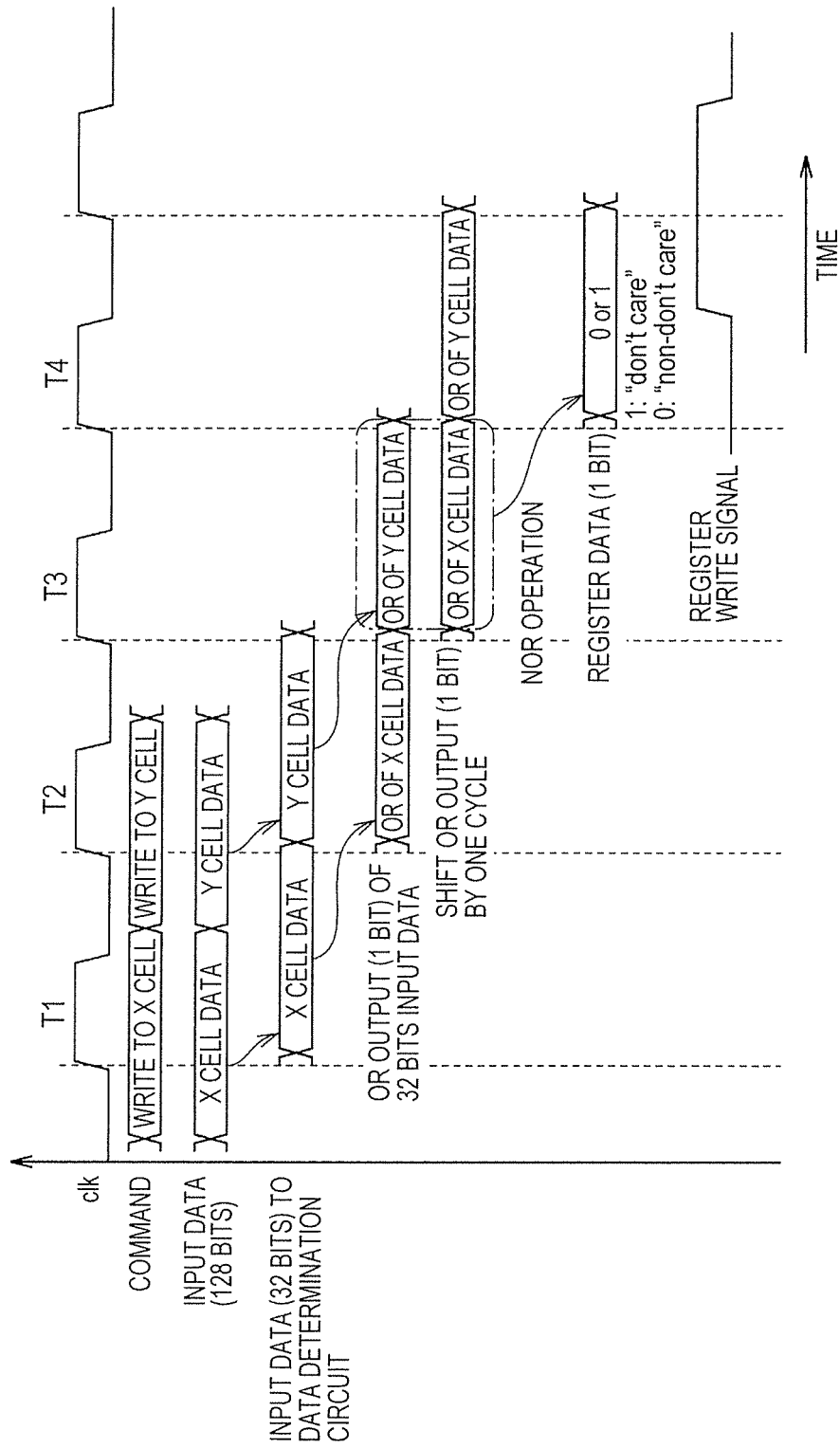
FIG. 21 is a timing chart illustrating the data write procedure of a register REG3 illustrated in FIG. 18 in the TCAM device according to Embodiment 3.

FIG. 21 is a timing chart illustrating the data write procedure of the register REG3 illustrated in FIG. 18 in the TCAM device according to Embodiment 3. In FIG. 21, a cycle is a period from a positive edge of a clock signal clk to the following positive edge.

With reference to FIG. 19 and FIG. 21, first, in the neighborhood of changing to the cycle T1 (from the second half of a cycle immediately before the cycle T1 toward the first half of the cycle T1), the write data for the X cell (128 bits) and the command for directing the write to the X cell are inputted into the data input circuit 31 and the command input circuit 32, respectively. The data input circuit 31 divides the inputted X-cell data (128 bits) in units of 32 bits, and outputs each of the X-cell data (32 bits) after the division to the corresponding sub-array SA and the corresponding data determination circuit 33. The command input circuit 32 outputs the inputted command (write to the X cell) to each sub-array SA and each data determination circuit 33. In the cycle T1, each data determination circuit 33 fetches the corresponding X-cell data of 32 bits.

Subsequently, in the neighborhood of changing to the cycle T2 (from the second half of the cycle T1 toward the first half of the cycle T2), the write data for the Y cell (128 bits) and the command for directing the write to the Y cell are inputted into the data input circuit 31 and the command input circuit 32, respectively. The data input circuit 31 divides the inputted Y-cell data (128 bits) in units of 32 bits, and outputs each of the Y-cell data (32 bits) after the division to the corresponding sub-array SA and the corresponding data determination circuit 33. The command input circuit 32 outputs the inputted command (write to the Y cell) to each sub-array SA and each data determination circuit 33.

In the cycle T2, each data determination circuit 33 fetches the corresponding Y-cell write data of 32 bits. Each data determination circuit 33 performs the OR operation of all the bits of the X-cell data fetched in the cycle T1, and holds the operation result ("0" or "1") at the first bit of the 2-bit shift register provided every data determination circuit 33, for example.

In the following cycle T3, the OR operation result of the X-cell data is shifted to the second bit of the shift register. Each data determination circuit 33 performs the OR operation of all the bits of the Y-cell data fetched in the cycle T2, and holds the operation result ("0" or "1") to the first bit of the above-described shift register. Subsequently, each data determination circuit 33 performs the NOR operation of the first bit and the second bit of the corresponding shift register (that is, the NOR operation of the OR operation result of the X-cell data obtained in the cycle T2 and the OR operation result of the Y-cell data obtained in the cycle T3 is further performed). When the final result of the above logical operation is "1", it turns out that the whole bits of the 32-bit X-cell data and the 32-bit Y-cell data are "0", that is, all the bits of the 32-bit write data are a don't care.

In the following cycle T4, the data determination circuit 33 outputs the NOR operation result to each register REG3 of the corresponding sub-array SA, as the register data reg_data. The data determination circuit 33 activates (sets to an "H" level) a register write signal reg_w_sig to be supplied to the register REG3 provided in the match amplifier MA corresponding to a write target entry, at a negative edge of the clock signal clk in the cycle T4. As a result, when all the values of the TCAM cell of the write target entry are a don't care, "1" (an "H" level) is set to the register REG3, otherwise (in the case of a non-don't care), "0" (an "L" level) is set to the register REG3. The reason for generating the register write signal reg_w_sig at the negative edge of the clock signal clk is for fully securing the setup time and the hold time.

[A Modified Example of the Match Amplifier]

Figure 22:
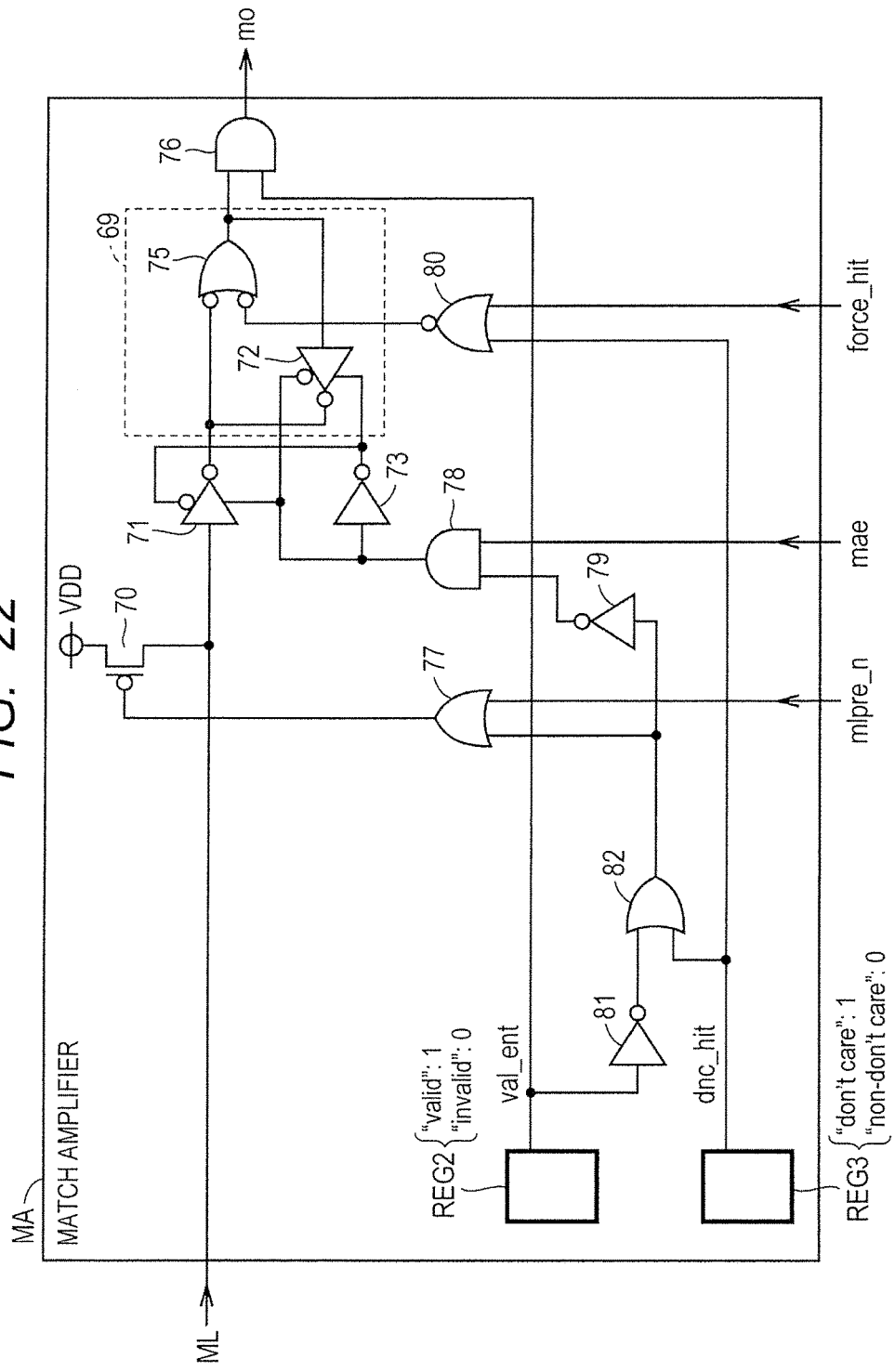
FIG. 22 is a block diagram illustrating a modified example of the match amplifier MA illustrated in FIG. 18.

FIG. 22 is a block diagram illustrating a modified example of the match amplifier MA illustrated in FIG. 18. The match amplifier MA illustrated in FIG. 22 can be also applied when the corresponding row is an invalid entry in which data is not stored.

Specifically, the match amplifier MA illustrated in FIG. 22 is different from the match amplifier MA illustrated in FIG. 18 in that a register REG2, an AND gate 76, an inverter 81, and an OR gate 82 are further included.

The register REG2 is set at an "L" level (defined as "0" in the present description), when the corresponding row of the sub-array is an invalid entry, and is set at an "H" level (defined as "1" in the present description) when the corresponding raw is a valid entry. The register REG2 is necessary only to be provided corresponding to the match amplifier MA for every row of the sub-array SA; accordingly, the register REG2 does not necessarily need to be provided inside the match amplifier MA as illustrated in FIG. 22. The above-described setup of the value of the register REG2 may be performed by a dedicated circuit provided inside the TCAM device or may be performed from the exterior of the TCAM device (for example, the NPU 101 illustrated in FIG. 6).

The AND gate 76 outputs the AND operation result of a control signal val_ent outputted from the register REG2 and an output signal of the logic gate 75, as an output signal mo of the match amplifier MA. Therefore, when the setting value of the register REG1 is "1" (don't care), or when the setting value of the register REG2 is "0" (invalid) even if the setting value of the register REG3 is "1" (don't care), priority is given to the invalid setup of the register REG2; accordingly, it is possible to set the output signal mo of the match amplifier MA at an "L" level (miss).

The OR gate 82 performs the OR operation of the control signal dnc_hit outputted from the register REG3 and a value obtained by inverting the logical level of the control signal val_ent outputted from the register REG2 with the inverter 81.

The OR gate 77 performs the OR operation of the output value of the OR gate 82 and the match line precharge signal mlpre_n, and outputs the operation result to the gate of the P-channel MOS transistor 70. Therefore, when the control signal dnc_hit according to the setting value of the register REG3 is at an "H" level (don't care), and/or when the control signal val_ent according to the setting value of the register REG2 is at an "L" level (invalid), the MOS transistor 70 is fixed to an OFF state; accordingly, the precharge of the match line ML does not take place.

The AND gate 78 performs the AND operation of a value obtained by inverting the logical level of the output value of the OR gate 82 with the inverter 79 and the match-amplifier enable signal mae. The AND operation result of the AND gate 78 and a signal obtained by inverting the logical level of the AND operation result with the inverter 73 are supplied to the driving power supply nodes of the inverters 71 and 72. Therefore, when the control signal dnc_hit according to the setting value of the register REG3 is at an "H" level (don't care), and/or when the control signal val_ent according to the setting value of the register REG2 is at an "L" level (invalid), the inverter 71 becomes in a non-operating state, and the inverter 72 becomes in an operating state; accordingly, the potential of the match line ML is not outputted to the subsequent-stage circuit and the potential of the match line ML is not latched.

The configuration of other elements of FIG. 22 is the same as those of FIG. 18; therefore, the same reference symbol is attached to the same or corresponding element and the repeated explanation thereof is omitted.

In this way, the search result is obvious (as a miss) also when the row corresponding to the match amplifier MA is an invalid entry. Accordingly, the precharge operation of the match line ML is stopped and the circuit operation of the match amplifier MA is stopped. In this case, the output signal of the match amplifier MA is fixed to an "L" level (miss) and the normal search result is outputted.

It is also possible to adopt a modified example in which the inverter 81 and the OR gate 82 in FIG. 22 are not provided. That is, the control signal val_ent outputted from the register REG2 is inputted only into the AND gate 76. In this case, only by setting the register REG2 as "0" (invalid), it is not possible to stop the precharge of the corresponding match line ML or the circuit operation of the match amplifier MA. Therefore, when the register REG2 is set as "0" (invalid), it is always necessary to set the register REG3 as "1" (don't care).

[The Effect of Embodiment 3]

As described above, even when the data of all the cells in the sub-array is not a don't care, when the data of all the cells includes a row of a don't care (hereinafter called "a don't-care entry") or the invalid entry in which data is not set, the search result of the row concerned is obvious. In such a case, the precharge operation of the match line ML of the row concerned (the don't-care entry or the invalid entry) is stopped and the circuit operation of the match amplifier MA is stopped. Accordingly, it is possible to reduce the power consumption of the TCAM device. In addition, it is possible to perform the normal search operation, by fixing the output signal from the match amplifier MA corresponding to the don't-care entry at an "H" level (hit), and by fixing the output signal from the match amplifier MA corresponding to the invalid entry at an "L" level (miss).

According to the TCAM device according to Embodiment 3, it is possible to provide the low power consumption means which is effective when a don't-care entry or an invalid entry are scattered in the sub-array.

<Embodiment 4>

As for a TCAM device according to Embodiment 4, the explanation is made for the case where the register REG1 for stopping the search operation of the whole sub-array, explained in FIG. 10 and FIG. 11, is not provided. In this case, it is determined whether the search operation of the whole sub-array is stopped or not, based on the setting value of the register REG3 provided for every match amplifier MA explained in FIG. 18 and FIG. 22. Hereinafter, the detailed explanation is made with reference to drawings.

[The Configuration of a Sub-Array]

Figure 23:
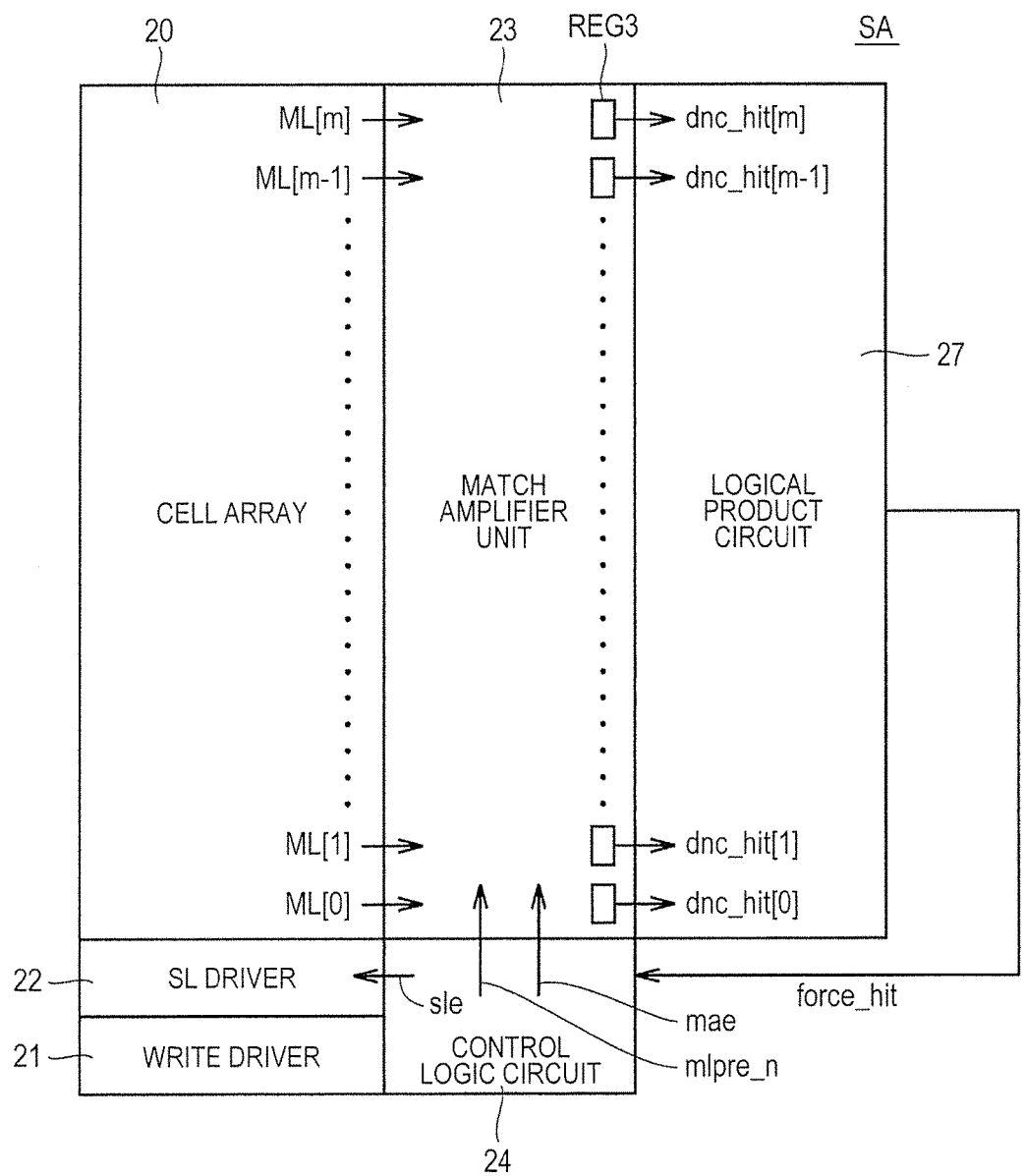
FIG. 23 is a block diagram illustrating schematically the configuration of a sub-array in a TCAM device according to Embodiment 4.

FIG. 23 is a block diagram illustrating the configuration of a sub-array schematically in the TCAM device according to Embodiment 4. The sub-array SA illustrated in FIG. 23 is different from the sub-array SA illustrated in FIG. 10 in that the register REG1 in the control logic circuit 24 is not provided but a logical product circuit 27 is provided in place of the register REG1. The configuration of other elements of FIG. 23 is the same as those of FIG. 10; therefore, the same reference symbol is attached to the same or corresponding element and the repeated explanation thereof is omitted.

The logical product circuit 27 takes the logical product of each of setting values dnc_hit[0]-dnc_hit[m] of the register REG3[0]-REG3[m], provided for every row (every match line ML) of the TCAM cell array 20, and outputs the operation result as a control signal force_hit. The control signal force_hit is inputted into the control logic circuit 24. As explained already, when data of all cells of the corresponding row in the sub-array is a don't care, the register REG3 is set as "1" ("H" level), otherwise the register REG3 is set as "0" ("L" level). Therefore, when data of all cells in the sub-array is a don't care, the control signal force_hit is set at an "H" level ("1"), otherwise the control signal force_hit is set at an "L" level ("0").

[The Configuration of the Control Logic Circuit]

Figure 24:
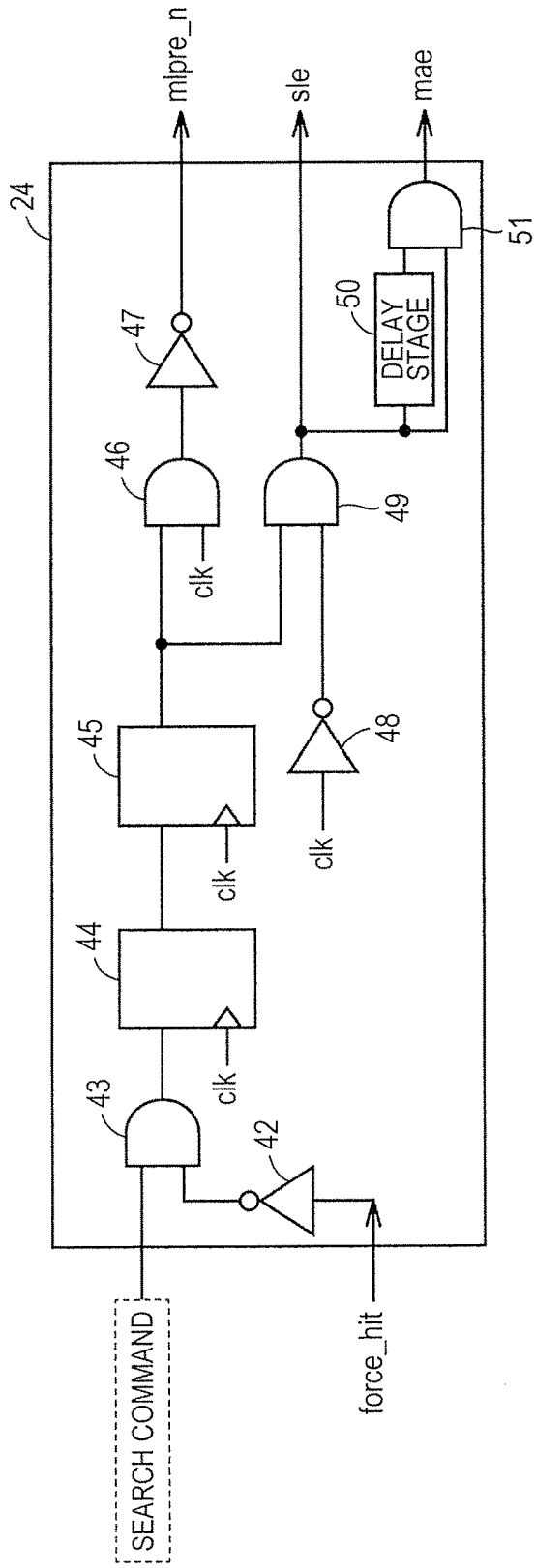
FIG. 24 is a circuit diagram illustrating the configuration of a portion related to a search operation in a control logic circuit 24 illustrated in FIG. 23.

FIG. 24 is a circuit diagram illustrating the configuration of a portion related to a search operation in the control logic circuit 24 illustrated in FIG. 23. The control logic circuit 24 illustrated in FIG. 24 is different from the control logic circuit 24 illustrated in FIG. 11 in that the register REG1 is not included. In FIG. 24, the control signal force_hit to be inputted to the inverter 42 is supplied from the logical product circuit 27 illustrated in FIG. 23.

Furthermore, in FIG. 24, the control signal force_hit is not outputted to each match amplifier MA from the control logic circuit 24. Therefore, in the match amplifier MA illustrated in FIG. 18 and FIG. 22, the inverter for inverting the logical level of the control signal dnc_hit outputted from the register REG3 is provided in place of the NOR gate 80. The output signal of this inverter is inputted into the logic gate 75. The configuration of other elements of FIG. 24 is the same as those of FIG. 11; therefore, the same reference symbol is attached to the same or corresponding element and the repeated explanation thereof is omitted.

[Effect of Embodiment 4]

According to the above-described configuration, data of all cells in the sub-array is set as a don't care; accordingly, when all registers REG3 provided for every row in the sub-array are set as a don't care, it is possible to stop the search operation of the sub-array automatically. As explained in FIG. 19 and FIG. 21, the setup of the value of the register REG3 can be performed automatically using the data determination circuit 33. Therefore, as the advantage, it is not necessary to analyze the contents of the TCAM cell data after the data write to the TCAM device in order to set up the value of the register REG1.

As a modified example, it is possible to adopt the configuration in which neither the register REG1 explained in FIG. 10 and FIG. 11 nor the logical product circuit 27 illustrated in FIG. 23 are provided. However, in the present modified example, when data of all cells in the sub-array is set as a don't care, it is possible to stop the precharge operation of all the match lines ML and the circuit operation of all the match amplifier MA; however, it is not possible to stop the operation of the search line driver 22. In the present embodiment, the logical product circuit 27 is provided in order to determine whether all the search operations can be stopped.

<Embodiment 5>

[On the Configuration of a Buffer Amplifier Unit]

Figure 25:
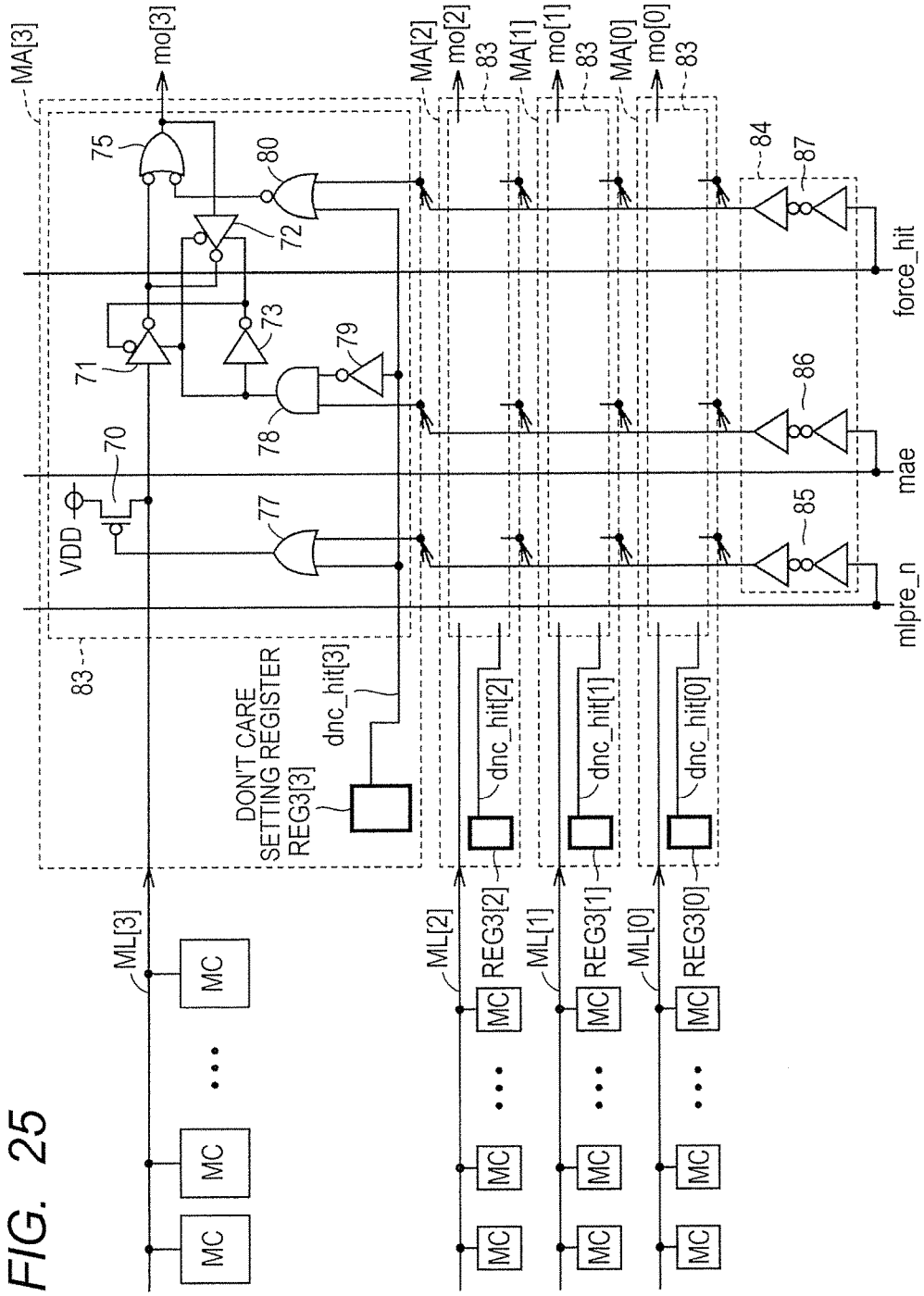
FIG. 25 is an explanatory drawing illustrating the arrangement of a buffer amplifier employed for an output signal from the control logic circuit 24.

FIG. 25 is an explanatory drawing illustrating the arrangement of a buffer amplifier employed for an output signal from the control logic circuit 24.

The control signal force_hit, the match line precharge signal mlpre_n, and the match-amplifier enable signal mae which are outputted from the control logic circuit 24 illustrated in FIG. 11 are outputted to all the match amplifiers MA in the sub-array. Therefore, when there are a number of entries for every sub-array, a buffer amplifier becomes necessary to be provided. Accordingly, in the case of FIG. 25, a buffer amplifier unit 84 is provided for every four match amplifiers MA.

With reference to FIG. 25, the buffer amplifier unit 84 is provided corresponding to four match amplifiers MA[0], MA[1], MA[2], and MA[3], and includes buffers 85, 86, and 87. The match line precharge signal mlpre_n is shaped by the buffer 85 and is inputted into an OR gate 77 of each of the four match amplifiers MA[0], MA[1], MA[2], and MA[3]. The match-amplifier enable signal mae is shaped by the buffer 86 and is inputted into an AND gate 78 of each of the four match amplifiers MA[0], MA[1], MA[2], and MA[3]. The control signal force_hit is shaped by the buffer 87 and is inputted into an NOR gate 80 of each of the four match amplifiers MA[0], MA[1], MA[2], and MA[3].

In FIG. 25, the circuit part 83 of the match amplifiers MA[0], MA[1], and MA[2] respectively excluding the registers REG3[0], REG3[1], and REG3[2] has the same configuration as the circuit part 83 of the match amplifier MA[3]; accordingly, the circuit diagrams thereof are not shown.

[A Modified Example of the Buffer Amplifier Unit]

Figure 26:
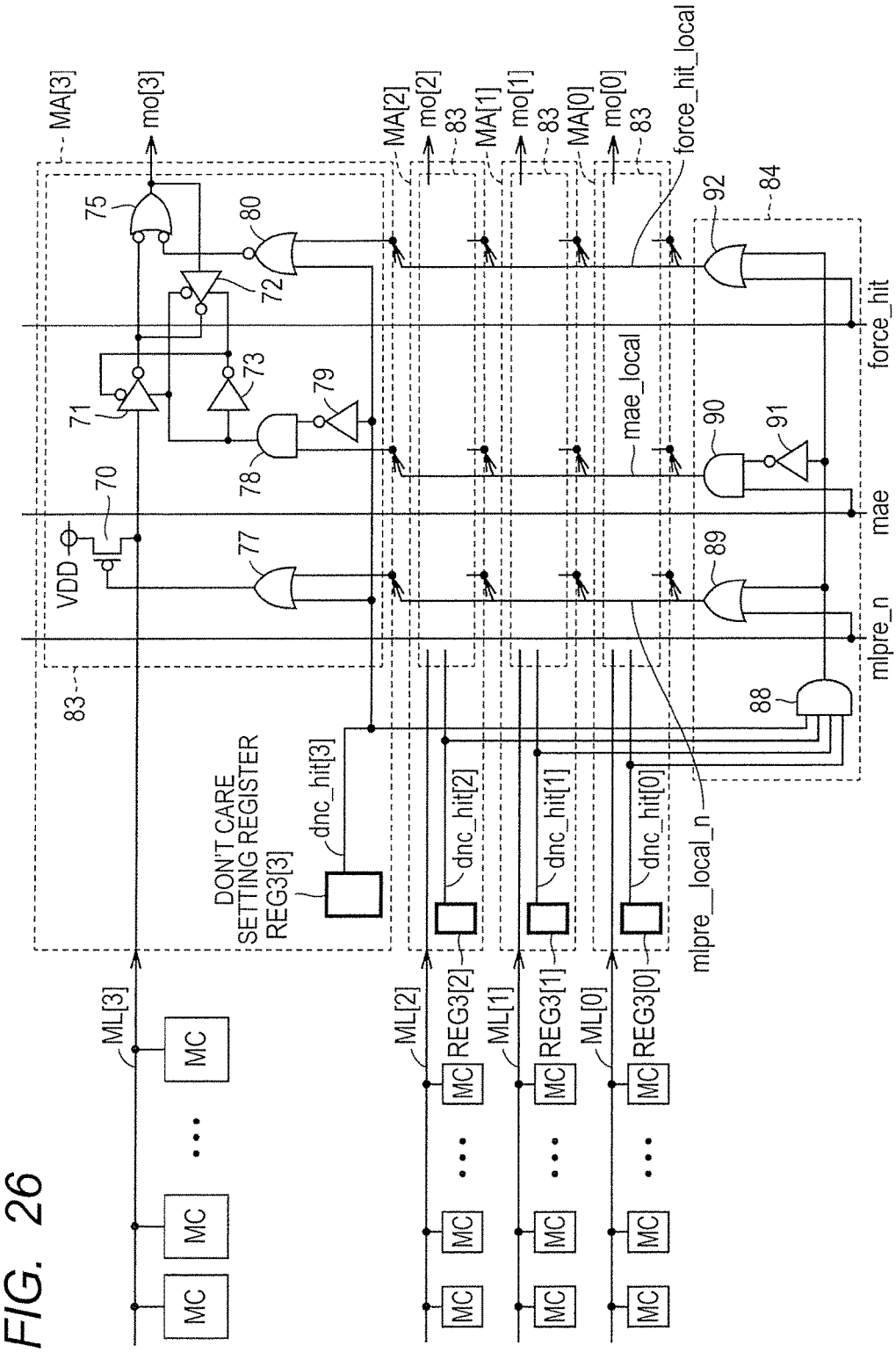
FIG. 26 is an explanatory drawing illustrating the configuration of a buffer amplifier unit in a TCAM device according to Embodiment 5.

FIG. 26 is an explanatory drawing illustrating the configuration of a buffer amplifier unit in the TCAM device according to Embodiment 5. The buffer amplifier unit 84 illustrated in FIG. 26 is equivalent to the buffer amplifier unit 84 illustrated in FIG. 25, and has a configuration modified in order to realize the low power consumption.

Specifically, in the buffer amplifier unit illustrated in FIG. 26, the logical operation is possible in addition to the shaping function of an input waveform, by providing a logic gate in place of the buffer illustrated in FIG. 25. That is, in the buffer amplifier unit 84 illustrated in FIG. 26, an OR gate 89 is provided in place of the buffer 85, an AND gate 90 and an inverter 91 are provided in place of the buffer 86, and an OR gate 92 is provided in place of the buffer 87.

The buffer amplifier unit 84 illustrated in FIG. 26 further includes an AND gate 88 which performs the AND operation of the control signals dnc_hit[0]-dnc_hit[3] outputted from the registers REG3[0]-REG3[3] provided in the corresponding match amplifiers MA[0]-MA[3]. The AND gate 88 outputs a signal of "H" level when all the control signals dnc_hit[0]-dnc_hit[3] outputted from the registers REG3[0]-

REG3[3] are at an "H" level (corresponding to the setting value "1") indicating a don't care.

The OR gate 89 outputs the OR operation result of the match line precharge signal mlpre_n and the output signal of the AND gate 88 to the corresponding match amplifiers MA[0]-MA[3] as a local match line precharge signal mlpre_local_n. The AND gate 90 outputs the AND operation result of the match-amplifier enable signal mae and a signal obtained by inverting the logical level of the output signal of the AND gate 88 with the inverter 91, to the corresponding match amplifiers MA[0]-MA[3] as a local match-amplifier enable signal mae_local. The OR gate 92 outputs the OR operation result of the control signal force_hit and the output signal of the AND gate 88 to the corresponding match amplifiers MA[0]-MA[3] as a local control signal force_hit_local.

Therefore, when all the control signals dnc_hit[0]-dnc_hit[3] outputted from the corresponding registers REG3[0]-REG3[3] are at an "H" level (corresponding to "1") indicating a don't care, the local match line precharge signal mlpre_local_n is fixed to an "H" level, and the local match-amplifier enable signal mae_local is fixed to an "L" level. Furthermore, the local control signal force_hit_local is fixed to an "H" level in this case. Therefore, it is possible to reduce the current consumption otherwise required for the charge and discharge of the wiring for transferring these local control signals. Furthermore, the above-described buffer amplifier unit is the modified circuit of the circuit necessary also in Embodiment 1-Embodiment 4; therefore, the substantial increase in the area hardly arises.

<Embodiment 6>

FIGS. 27A, 27B, and 27C are explanatory drawings illustrating the procedure of the data write to each of registers REG1, REG2, and REG3 after the power supply starting. Three sub-arrays SA[0, 0], SA[1, 0], and SA[2, 0] are representatively illustrated in FIGS. 27A, 27B, and 27C. In each sub-array, the register REG1 explained in FIG. 10 and FIG. 11 is provided in the control logic circuit 24, and the registers REG2 and REG3 explained in FIG. 18 and FIG. 22 are provided for every row.

The register REG1 is for setting up whether the cell data of the whole sub-array is a don't cares ("1") or a non-don't care ("0"). The register REG2 is for indicating whether the corresponding row is a valid entry ("1") in which data is written in each TCAM cell, or an invalid entry ("0") in which data is not written. The register REG3 is for setting up whether all the cell data of the corresponding row are a don't care ("1") or a non-don't care ("0").

The write of data to each register may be performed by the dedicated circuit inside the TCAM device (for example, the data determination circuit 33 illustrated in FIG. 19), or it may be performed by the processor outside the TCAM device (for example, the NPU 101 illustrated in FIG. 6).

With reference to FIG. 27A, immediately after the power supply starting, all the registers REG1, REG2, and REG3 are in an unfixed state. In FIG. 27A, hatching is attached to indicate that a register is in an unfixed state.

With reference to FIG. 27B, in the initial state before writing data in the TCAM device, "1" (don't care) is set to each register REG1, "0" (invalid) is set to each register REG2, and "1" (don't care) is set to each register REG3.

FIG. 27C illustrates schematically the state (searchable state) after writing an ACL rule file in the TCAM device. As illustrated in FIG. 27C, data is already written in the TCAM cell of all the rows of the sub-array SA[0, 0]. Data is not written in the TCAM cell of some rows of the sub-array SA[1, 0]. Data is not written in the TCAM cell of any rows of the sub-array SA[2, 0].

When writing data in the TCAM cell of a certain row, the value of the register REG2 corresponding to the row concerned is changed from "0" (invalid) to "1" (valid), and, in many cases, the value of register REG3 is changed from "1" (don't care) to "0" (non-don't care). However, when all the cell data of the row concerned are a don't care, the value of the register REG3 is maintained at "1." At the time when the value of "1" or "0" (that is, except for a don't care) is written in one of the TCAM cells of the sub-array, the value of the register REG1 is changed from "1" (don't care) to "0" (non-don't care).

As a result of performing data write to each register according to the above procedure, as illustrated in FIG. 27C, in the sub-array SA[0, 0] in which data has been written in the TCAM cell of all the rows, the register REG1 is set to "0" (non-don't care), each register REG2 is set to "1" (valid), and each register REG3 is set to "0" (non-don't care). The match amplifier MA corresponding to each row outputs a signal at an "H" level (match) or at an "L" level (miss) based on the comparison result of the data written in each TCAM cell and the corresponding part of the search data.

In the sub-array SA[1, 0] in which data has been written in the TCAM cell of some rows, the register REG1 is set to "0" (non-don't care). The registers REG2 and REG3 corresponding to the valid entry in which data has been written are set to "1" (valid) and "0" (non-don't care), respectively. The match amplifier MA corresponding to these rows outputs a signal (an "H" level (match) or an "L" level (miss)) based on the search result.

On the other hand, in the sub-array SA[1, 0], the values of the registers REG2 and REG3 corresponding to the invalid entry in which data has not been written do not change and maintain "0" (invalid) and "1" (don't care) as set in the initial setting, respectively. The match amplifier MA corresponding to these rows outputs a signal at an "L" level (miss) according to the value "0" (invalid) of the register REG2. As for the unused area, the values of the registers REG2 and REG3 are set as "0" (invalid) and "1" (don't care), respectively; accordingly, the precharge operation of the match line ML is stopped and the circuit operation of the match amplifier MA is stopped. Accordingly, it is possible to reduce the power consumption of the TCAM device.

In the sub-array SA[2, 0] in which data is not written in all the TCAM cells, the values of registers REG1, REG2, and REG3 do not change, maintaining the values "1" (don't care), "0" (invalid), and "1" (don't care) as set in the initial setting, respectively. The match amplifier MA corresponding to each row outputs a signal at an "L" level (miss) according to the value "0" (invalid) of the register REG2. Due to the value of register REG1 being set as "1" (don't care), the search operation of the sub-array SA[2, 0] can be stopped (that is, the precharge of the match line ML, the circuit operation of the match amplifier MA, and the search line driver 22 can be stopped). Accordingly, it is possible to reduce the consumption current.

In this way, it is possible to set the value of each register efficiently and easily by making initial setting of the value of each of the registers REG1, REG2, and REG3, and by changing the value of each of the registers REG1, REG2, and REG3 according to the value of write data at the time of writing data to the TCAM cell.

When the match amplifier MA is comprised as illustrated in FIG. 22, even if the value of the register REG3 is set as "0" (non-don't care), it is possible to stop the precharge of the match line ML and the circuit operation of the match amplifier MA as far as the value of the register REG2 is set as "0" (invalid). Accordingly, in this case, the value of the register REG3 may be set as "0" (non-don't care) in the initial setting of FIG. 27B.

<Embodiment 7>

The low power consumption technology of the TCAM device explained in Embodiment 1-Embodiment 6 described above can be applied only when all the TCAM cells coupled to the match line ML of each sub-array are set as a don't care. Accordingly, even in a case where a comparatively large number of TCAM cells set as a don't care are continuously located, if these TCAM cells extend across two match lines, and if the TCAM cell set as "1" or "0" is included in each match line, it is impossible to apply the low power consumption technology described above.

In Embodiment 7, the above-described low power consumption technology can be applied in cases such as described above, by changing the arrangement of the TCAM cell data. Hereinafter, the detailed explanation is made with reference to drawings. The bit width of the input data and the number of divisions of the input data, employed by the following explanation, are an example and are not restricted to this example.

FIGS. 28A and 28B are explanatory drawings illustrating the array conversion of input data. FIG. 28A illustrates an example in which data is inputted into two sub-arrays SA_0 and SA_1 in the order as it is, without performing an array conversion, when the bit width of the input data is 32 bits. That is, at the time of data write, the 16-bit write data (bit numbers 0-15) of the first half among the 32-bit write data are written in 16 TCAM cells (bit numbers 0-15) of the sub-array SA_0, respectively, and the 16-bit write data (bit numbers 16-31) of the second half are written in 16 TCAM cells (bit numbers 16-31) of the sub-array SA_1, respectively. Similarly at the time of search, the 16-bit search data (bit numbers 0-15) of the first half among the 32-bit input search data are inputted in 16 TCAM cells (bit numbers 0-15) of the sub-array SA_0, respectively, and the 16-bit search data (bit numbers 16-31) of the second half are inputted into 16 TCAM cells (bit numbers 16-31) of the sub-array SA_1, respectively.

Here, when the array conversion of data is not performed, it is assumed, as illustrated in FIG. 28A, that the data of "1" or "0" is written in each TCAM cell (a black square in the drawing) from the bit number 0 to the bit number 9, and from the bit number 29 to the bit number 31. It is also assumed that the data indicating a don't care is written in each of 19 consecutive TCAM cells (a hatched square in the drawing) from the bit number 10 to the bit number 28. In this case, there are 16 or more number of data bits indicating a don't care, and they are continue; however, the TCAM cells which store the data indicating a don't care are lying astride the sub-array SA_0 and the sub-array SA_1. Accordingly, in addition to the TCAM cell set as a don't care, the TCAM cell set as "0" or "1" is also coupled to each of the match lines ML_0 and ML_1. Therefore, it is impossible to apply the above-described low power consumption technology.

The example of FIG. 28B changes the data array in the example of FIG. 28A, so that all the TCAM cells coupled to the match line ML_1 of the sub-array SA_1 are set as a don't care. Accordingly, it becomes possible to apply the above-described low power consumption technology. Specifically, the data array is changed and the arrangement order of the portion of the bit numbers 29-31 among the input data (the write data and the search data) is moved forward so that the data of the portion are inputted into the TCAM cell of the bit numbers 10-12, respectively. Furthermore, the data array is changed and the arrangement order of the portion of bit numbers 10-28 among the input data is moved downward so that the data of the portion are inputted into the TCAM cell of the bit numbers 13-31, respectively. As a result, as illustrated in FIG. 28B, it is possible to set all the TCAM cells (the bit numbers 16-31) coupled to the match line ML_1 of the sub-array SA_1 as a don't care (a hatched square in the drawing). Therefore, it is possible to implement the above-described low power consumption technology (stop of the precharge of the match line ML_1 and stop of the operation of the match amplifier MA_1).

Figure 29:
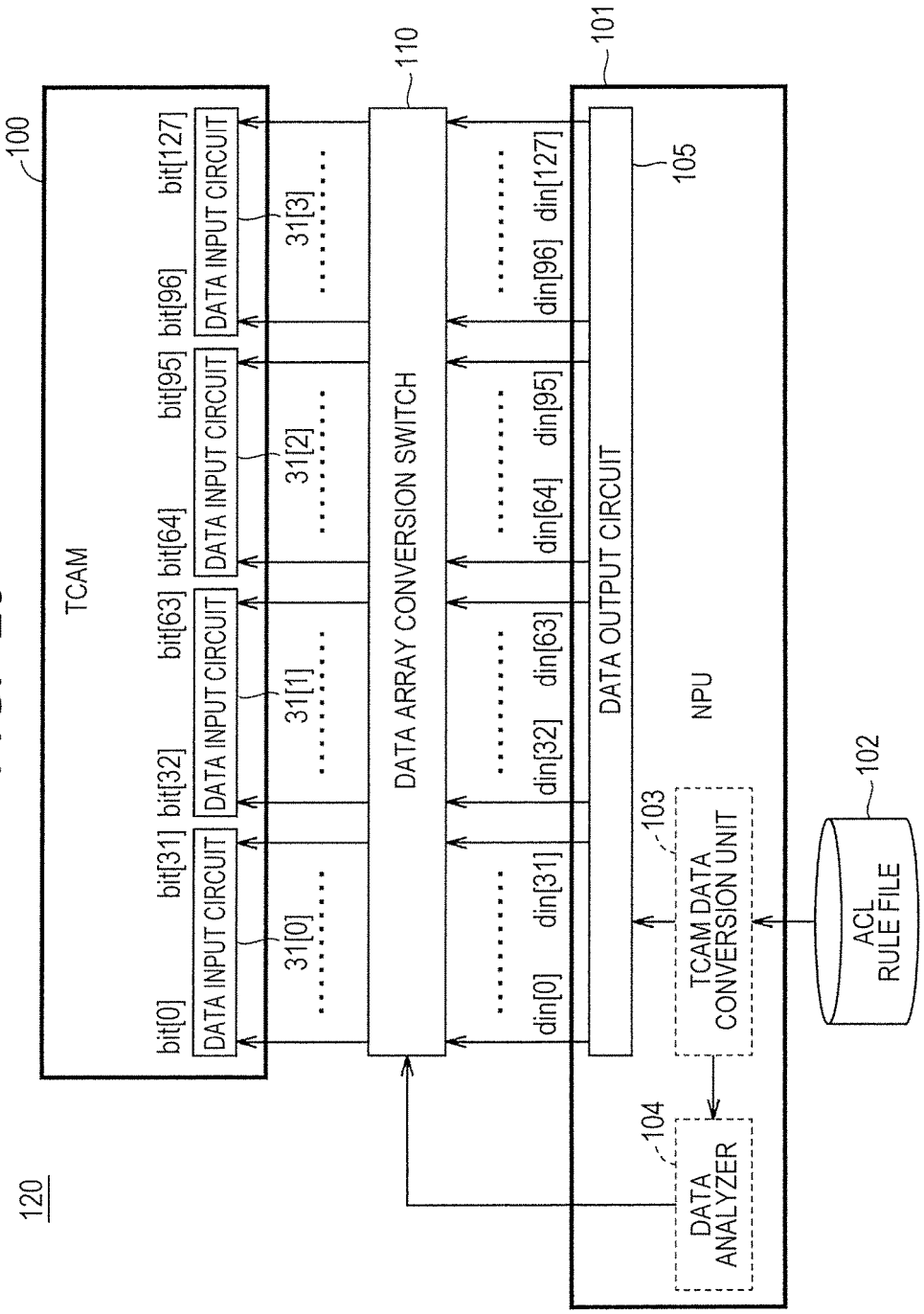
FIG. 29 is a block diagram illustrating the configuration of a search system according to Embodiment 7.

FIG. 29 is a block diagram illustrating the configuration of a search system according to Embodiment 7. The search system 120 illustrated in FIG. 29 is different from the search system 120 illustrated in FIG. 6 in that a switching circuit 110 for converting a data array (hereinafter called a data array conversion switch) is further included. FIG. 29 illustrates an example of 128 bits as the number of bits of the input data din.

With reference to FIG. 29, the ACL rule file stored in the memory device 102 is converted into the TCAM data by a data converter 103 included in the NPU (Network Processor Unit) 101. The TCAM data is comprised of three values of "0", "1", and "a don't care" ("1" or "0"). The TCAM data is inputted into the data array conversion switch 110 from the data output circuit 105 of the NPU 101 as the input data din[0:127].

The data array conversion switch 110 changes the arrangement order of the input data din[0:127] (write data and search data) in accordance with the rule determined in advance. The data array conversion switch 110 inputs the input data after changing the arrangement order into the data input circuits 31[0]-31[3] of the TCAM device 100. In the case of FIG. 29, the data input circuits 31[0]-31[3] are divided into four corresponding to each sub-array (for example, the data input circuit 31[0] corresponds to the bit numbers 0-31). The conversion rule in the data array conversion switch 110 is determined by the data analyzer 104 included in the NPU 101, based on the analysis result of the TCAM data.

Figure 30:
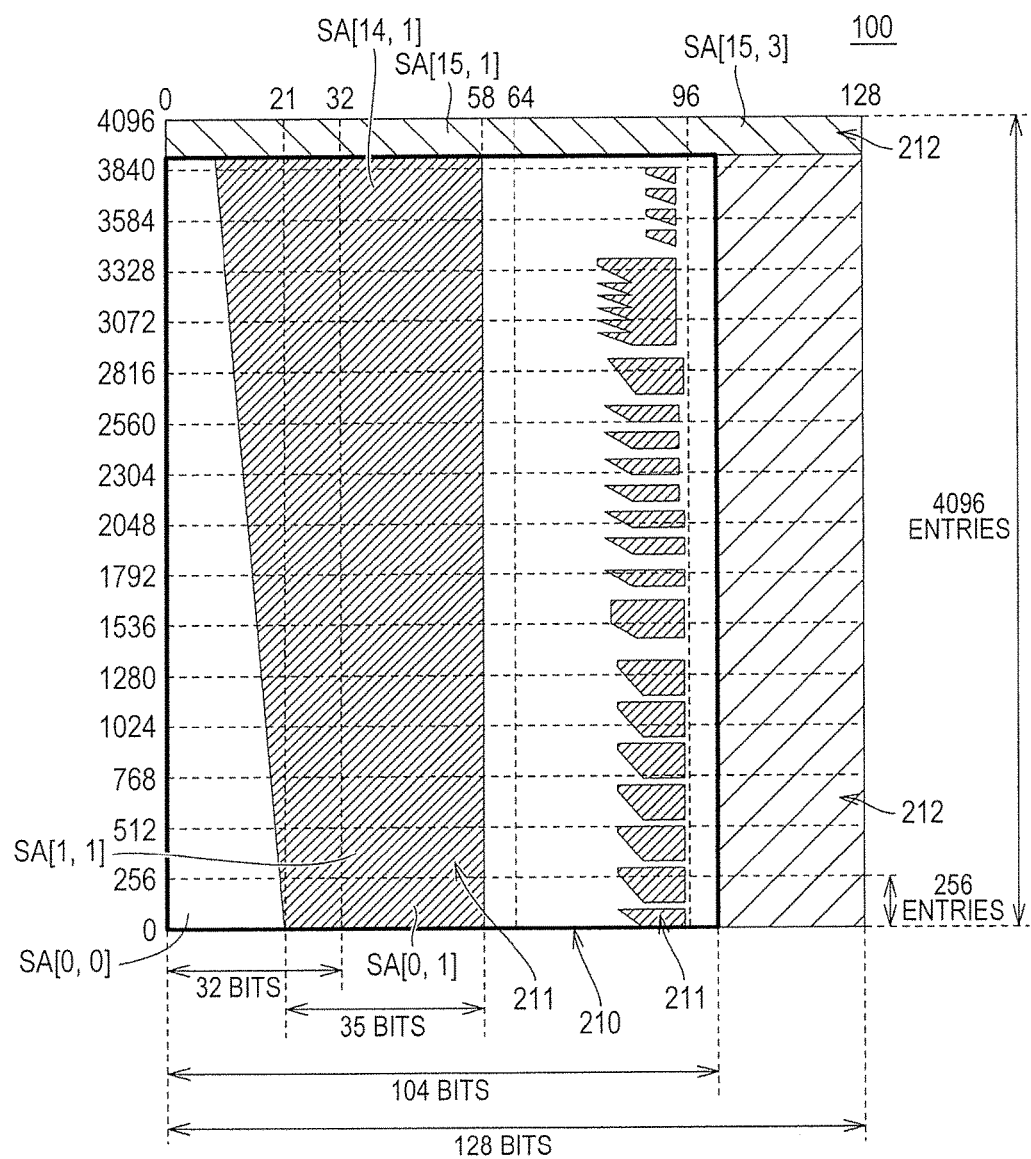
FIG. 30 is a drawing illustrating schematically the memory state of the TCAM device in which an example of the TCAM data as a target of data array conversion is written.

FIG. 30 is a drawing illustrating schematically the memory state of the TCAM device in which an example of the TCAM data as a target of data array conversion is written. The drawing showing the memory state illustrated in FIG. 30 corresponds to FIG. 9, and is different from FIG. 9 in the arrangement of the area 211 (a densely hatched area in the figure) where the don't care data is stored. The other points illustrated in FIG. 30 are the same as those illustrated in FIG. 9. Therefore, the same reference symbol is attached to the same or corresponding element and the repeated explanation thereof is omitted.

In the case of the arrangement of the TCAM data illustrated in FIG. 30, there are some areas where the bit width of the area indicating a don't care exceeds 32 bits as the bit width of the sub-array SA; however, there is no area where the don't care is set over the whole bit width of one sub-array SA. Therefore, it is impossible to apply the low power consumption technology of Embodiment 1-Embodiment 6 described above.

Therefore, for example, all the data of the portion of the bit numbers 26-31 and all the data of the portion of the bit numbers 58-63 are changed using the data array conversion switch illustrated in FIG. 29. According to this data array conversion, in 16 sub-arrays SA[0, 1] and SA[1, 1]-SA[15, 1] of the portion of the bit numbers 32-63, all the TCAM cell data except an invalid entry can be set as a don't care. As a result, in each of the sub-arrays SA[0, 1] and SA[1, 1]-SA [15, 1], it is possible to stop the search operation by setting the register REG1 as "1" (don't care). As for the sub-array SA[15, 1], it is possible to set the output signal of the match amplifier MA at an "L" level (miss), by setting the register REG2 of the invalid entry as "0" (invalid).

As described above, Embodiment 7 discloses the technology which enables the realization of the low power consumption, in the case where the area set as a don't care with the data width more than the bit width of a sub-array exists regarding all the entries of the TCAM device except an invalid entry. In this case even when all the TCAM cells coupled to the match line of the sub-array are not set as a don't care, it is possible to apply the low power consumption technology explained in the embodiments described so far, by changing the data array according to the bit number corresponding to each match line. Therefore, in order to build the search system of low power consumption, it is desirable to open to a user the bit number to which each match line corresponds, in the specifications, for example.

In the embodiment described above, the data array is changed for all the entries of the TCAM device. However, by providing a switching circuit for changing the data array in every sub-array SA, it is also possible to change the data array in units of entries belonging to the sub-array.

<Embodiment 8>

In Embodiment 1-Embodiment 7, all the sub-arrays perform the search operation with the almost same timing, and the priority encoder outputs the search result based on the output signal of each sub-array. Embodiment 8 discloses an example in which multiple sub-arrays arranged in the row direction (accordingly corresponding to a common entry) perform search sequentially in a pipeline system. In this case, each sub-array starts the search operation after the end of the search operation of the sub-array in the respective previous stage.

Figure 31:
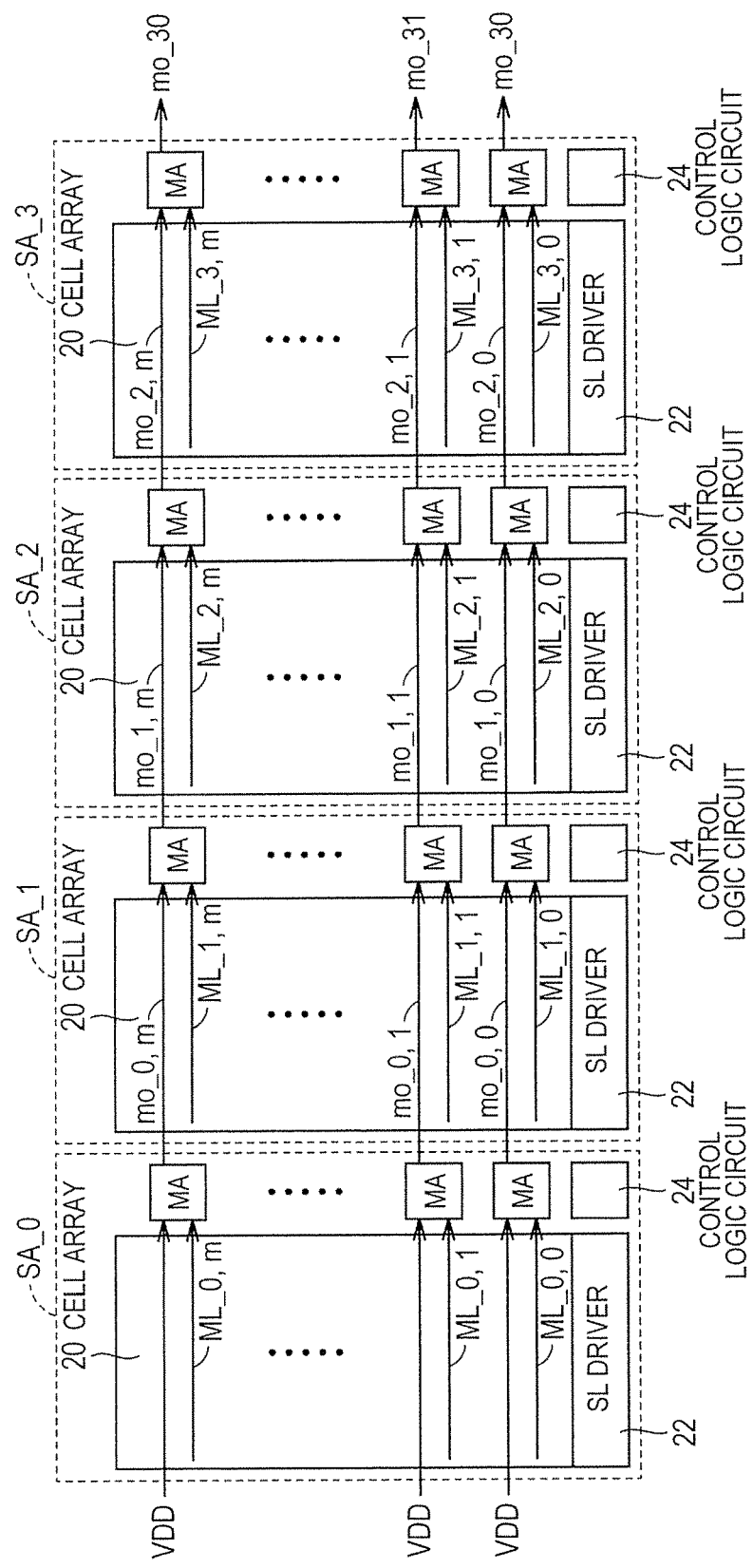
FIG. 31 is a block diagram illustrating the configuration of a TCAM device according to Embodiment 8.

FIG. 31 is a block diagram illustrating the configuration of a TCAM device according to Embodiment 8. In the TCAM device illustrated in FIG. 31, four sub-arrays SA_0-SA_3 are illustrated representatively, and the priority encoder is not shown. The search operation is performed in the order of the sub-array SA_0, the sub-array SA_1, the sub-array SA_2, and the sub-array SA_3. Each sub-array SA is provided with m+1 match lines ML.

As illustrated in FIG. 31, in the sub-array SA_0, the potential of the match line ML_0, j (j=0, 1, 2, . . . , m) after the search and the power supply potential VDD are inputted into the corresponding match amplifier MA, and the output signal mo_0, j is outputted from the match amplifier MA. Similarly, in the sub-array SA_i (i=1, 2, 3), the potential of the match line ML_i, j (j=0, 1, 2, . . . , m) after the search and the output signal mo_i-1, j of the sub-array SA_i-1, j in the previous stage of the same entry are inputted into the corresponding match amplifier MA, and the output signal mo_i, j is outputted from the match amplifier MA.

Figure 32:
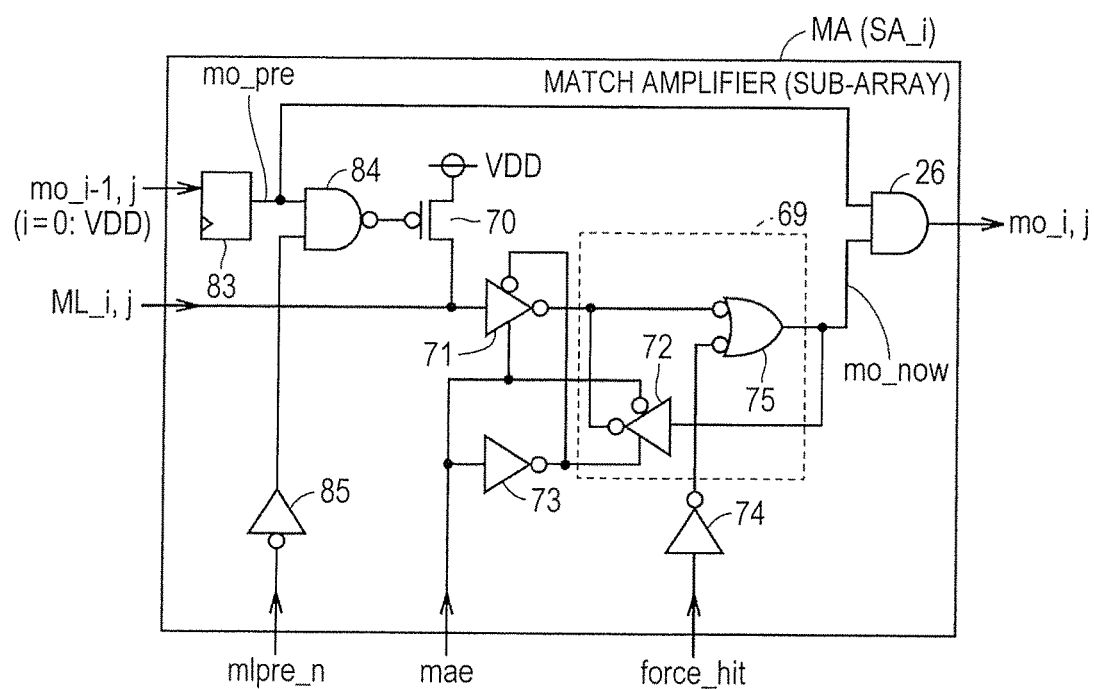
FIG. 32 is a circuit diagram illustrating an example of the configuration of a match amplifier MA illustrated in FIG. 31.

FIG. 32 is a circuit diagram illustrating an example of the configuration of the match amplifier MA illustrated in FIG. 31. The match amplifier MA of FIG. 32 illustrates an example of the configuration of the match amplifier coupled to the match line ML_i, j (j=0, 1, 2, . . . , m) in the sub-array SA_i (i=0, 1, 2, 3) illustrated in FIG. 31. FIG. 32 illustrates the configuration after changing the configuration of the match amplifier MA illustrated in FIG. 13. However, each of the match amplifiers MA illustrated in FIG. 16, FIG. 18, and FIG. 22 as well can be changed similarly.

Specifically, the match amplifier MA illustrated in FIG. 32 further adds a D flip-flop 83, an NAND gate 84, an inverter 85, and an AND gate 26 to the match amplifier MA illustrated in FIG. 13 (or FIG. 16, FIG. 18, and FIG. 22). The D flip-flop 83 and the AND gate 26 are illustrated in FIG. 32 as provided inside the match amplifier MA. However, the D flip-flop 83 and the AND gate 26 need only to be provided respectively corresponding to the match amplifier MA for every entry; accordingly, the D flip-flop 83 and the AND gate 26 may be provided outside the match amplifier MA.

The D flip-flop 83 holds the output signal mo_pre of the match amplifier MA of the corresponding row of the sub-array in the previous stage (the search result in the preceding cycle). However, as for the sub-array SA_0 (that is, i=0) which performs the search operation at the beginning of the search period, the power supply potential VDD is inputted in replace of the output signal of the match amplifier MA of the corresponding row in the previous stage.

The signal inputted into the gate of the P-channel MOS transistor 70 in the circuit before the change as illustrated in FIG. 13, is inverted in the logical level by the inverter 85 and inputted into the second input node of the NAND gate 84 after the change. The output signal mo_pre of the above-described D flip-flop 83 (the search result in the preceding cycle) is inputted into the first input node of the NAND gate 84. The operation result of the NAND gate 84 is inputted into the gate of the MOS transistor 70.

Accordingly, when the output signal mo_pre of the above-described D flip-flop 83 (the search result in the preceding cycle) is at an "L" level (miss), the signal of "H" level is inputted into the gate of the MOS transistor 70. As a result, the MOS transistor 70 becomes OFF at all times to stop the precharge of the match line ML.

The AND gate 26 performs an AND operation of the output signal mo_pre of the above-described D flip-flop 83 (the search result in the preceding cycle) and the output signal mo_now in the case of the match amplifier MA of the configuration before the change illustrated in FIG. 13 (or FIG. 16, FIG. 18, and FIG. 22), and outputs the operation result as the output signal mo of the match amplifier MA. The AND gate 26 corresponds to the AND gate illustrated in FIG. 5, and it can be considered that the AND gate 26 illustrated in FIG. 5 is placed inside the match amplifier MA.

Accordingly, when the output signal mo_pre of the above-described D flip-flop 83 (the search result of the corresponding row in the preceding cycle) is at an "L" level (miss), the output signal of the AND gate 26 (that is, the output signal mo of the match amplifier MA) becomes at an "L" level (miss). The other elements illustrated in FIG. 32 are the same as those of the match amplifier MA illustrated in FIG. 13 (or FIG. 16, FIG. 18, and FIG. 22). Therefore, the same reference symbol is attached to the same or corresponding element and the repeated explanation thereof is omitted.

Figure 33:
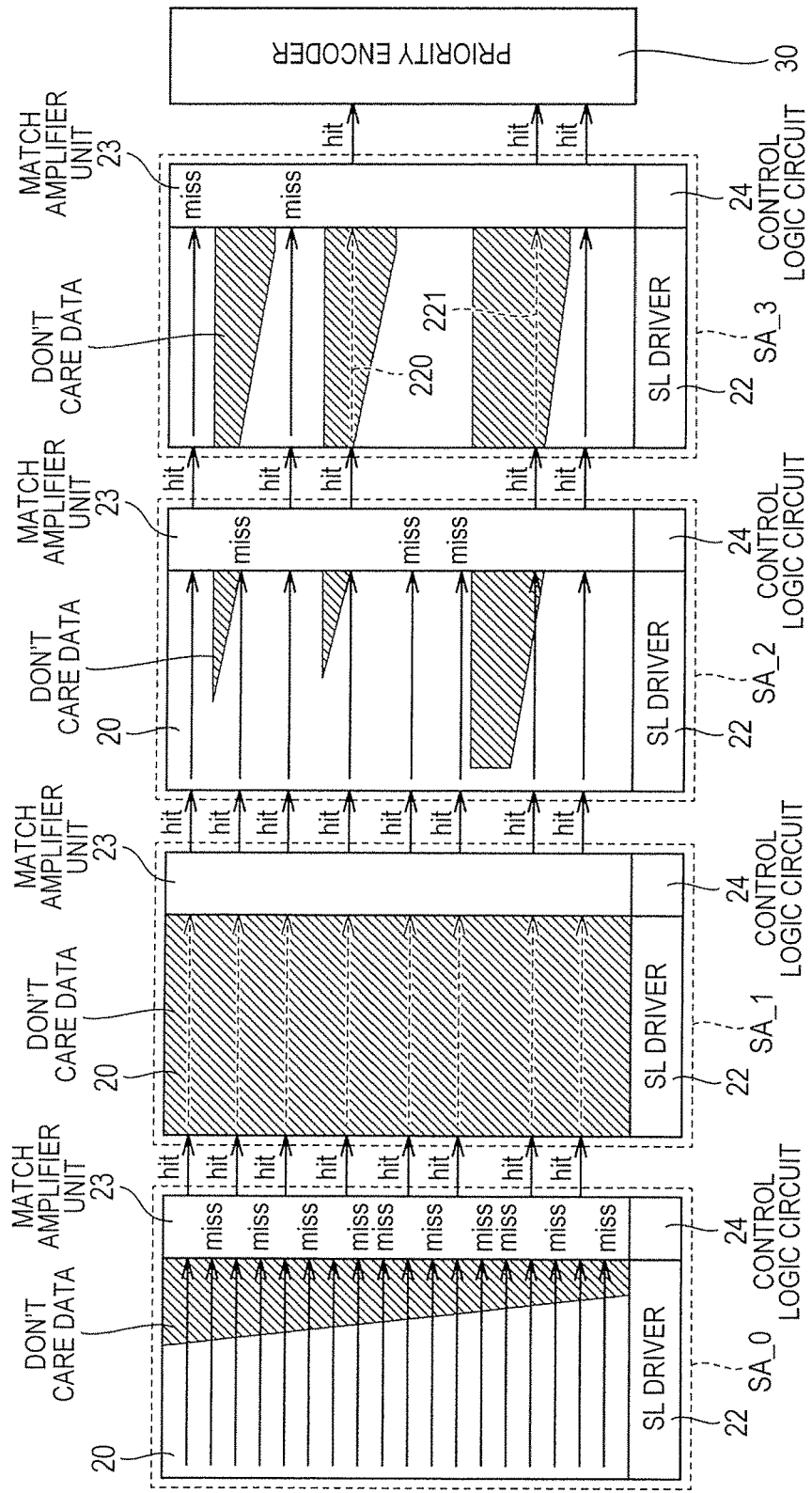
FIG. 33 is an explanatory drawing illustrating an operation of the TCAM device illustrated in FIG. 31.

FIG. 33 is an explanatory drawing illustrating an operation of the TCAM device illustrated in FIG. 31. The hatched area in each match amplifier MA indicates that the TCAM cell data is a don't care.

In the first cycle, the sub-array SA_0 performs the search operation. The search result ("1" in the case of a hit and "0" in the case of a miss) of each entry is stored in the D flip-flop 83 of the corresponding row of the match amplifier unit 23 of the sub-array SA_1 in the next stage. When "0" is stored in the D flip-flop 83 as explained in FIG. 32, the precharge of the match line ML of the corresponding row is stopped in the following second cycle.

In the second cycle, the search operation is usually performed only for the row which has become a hit in the search operation of the sub-array SA_0 in the preceding stage among the rows of the sub-array SA_1. However, in the case of FIG. 33, data of all the TCAM cells of the sub-array SA_1 are set as a don't care. Therefore, by setting the register REG1 as "1" (don't care), the search operation of the whole sub-array SA_1 is stopped. The output signal of the entry which has become a hit in the first cycle becomes a hit automatically, and "1" is written in the corresponding D flip-flop of the match amplifier unit 23 of the sub-array SA_2 in the next stage. "0" is written in other D flip-flops.

In the third cycle, the search operation is performed only for the row into which the signal indicative of a hit is inputted from the sub-array SA_1, among the rows of the sub-array SA_2. The match line precharge is stopped for the row in which "0" is stored in the D flip-flop 83. For the row of which the search result has been a hit in the sub-array SA_2, "1" is stored in the corresponding D flip-flop 83 of the match amplifier unit 23 of the sub-array SA_3 in the next stage. "0" is stored in the D flip-flop 83 of the other rows of the sub-array SA_3.

In the fourth cycle, the search operation is performed for the TCAM cell array of the sub-array SA_3. In this case, the search operation is performed for the row into which a signal indicative of a hit is inputted from the sub-array SA_2 in the preceding stage, except for the rows corresponding to the match lines 220 and 221. Since all the TCAM cells coupled to the match lines 220 and 221 are set as a don't care, the precharge of these match lines 220 and 221 and the circuit operation of the corresponding match amplifier MA are stopped, by setting "1" (don't care) to the register REG3. From the match amplifier MA coupled to the match lines 220 and 221, a signal indicative of a hit is outputted to the priority encoder 30 automatically. The search result is outputted to the priority encoder 30 also from the match amplifier MA of the other rows of which the search operation has been performed.

In this way, in Embodiment 8, in combination with the low power consumption technology explained in Embodiment 1-Embodiment 7, multiple sub-arrays arranged in the row direction are searched sequentially in the pipeline system, and the search operation is performed only for the entry which has become a hit in the preceding cycle. Accordingly, it is possible to reduce the power consumption.

As described above, the invention accomplished by the present inventors has been concretely explained based on the embodiments. However, it cannot be overemphasized that the present invention is not restricted to the embodiments as described above, and it can be changed variously in the range which does not deviate from the gist.

What is claimed is:

1. A semiconductor device comprising:
a plurality of sub-arrays, each of the sub-arrays including:
   a plurality of TCAM (Ternary Content Addressable Memory) cells arranged in rows and columns;
   a plurality of search line pairs respectively connected to ones of the TCAM cells arranged in the columns;
   a plurality of match lines respectively connected to ones of the TCAM cells arranged in the rows;
   a search line driver unit driving the search line pairs in response to a search line enable signal;
   a plurality of match amplifier units, each connected to a corresponding one of the match lines and configured to output a search result according to a potential of the corresponding one of the match lines;
   a register; and
   a control logic unit generating the search line enable signal based on a search command and register data in the register,
   wherein the register data indicates whether or not data stored in all the TCAM cells have a don't care value.

2. The semiconductor device according to claim 1, wherein, when the register data indicates that data stored in all the TCAM cells have a don't care value, the control logic unit generates the search line enable signal to inactivate the search line driver unit.

3. The semiconductor device according to claim 1, wherein, when the register data indicates that all of data stored in the TCAM cells has the don't care value, the control logic unit further generates a first control signal and each of the match amplifier units provides a search result of coincidence based on the first control signal.

4. The semiconductor device according to claim 3, wherein, when the register data indicates that all of data stored in the TCAM cells has the don't care value, each of the match amplifier units outputs the search result of coincidence before the control logic unit receives the search command.

5. The semiconductor device according to claim 1, wherein, when the register data indicates that a part of data stored in the TCAM cells is not the don't care value, the control logic generates the search line enable signal to activate the search line driver unit.

6. The semiconductor device according to claim 3, wherein the register of the sub-arrays is a first register,
   wherein each of the sub-arrays further comprises a plurality of second registers provided for an associated one of the match amplifier units,
   wherein each of the match amplifier units outputs a search result of non-coincidence when a second register data in a corresponding one of the second registers indicates a predetermined value, irrespective of the first control signal.

* * * * *